United States Patent [19]
Kao et al.

[11] Patent Number: 6,026,762
[45] Date of Patent: Feb. 22, 2000

[54] APPARATUS FOR IMPROVED REMOTE MICROWAVE PLASMA SOURCE FOR USE WITH SUBSTRATE PROCESSING SYSTEMS

[75] Inventors: Chien-Teh Kao, Sunnyvale; Kenneth Tsai, Redwood City; Quyen Pham, Union City; Ronald L. Rose, Los Gatos; Calvin R. Augason, Los Altos; Joseph Yudovsky, Palo Alto, all of Calif.

[73] Assignee: Applied Materials, Inc., Santa Clara, Calif.

[21] Appl. No.: 08/839,111

[22] Filed: Apr. 23, 1997

[51] Int. Cl.[7] .................................................. C23C 16/00
[52] U.S. Cl. .................................. 118/723 ME; 156/345; 315/111.21; 118/723 MW
[58] Field of Search .................. 118/223 ME, 723 MW, 118/723 MR, 723 MA; 156/345; 333/99 PL, 252; 315/111.21; 204/298.38

[56] References Cited

U.S. PATENT DOCUMENTS

| | | | |
|---|---|---|---|
| 4,433,228 | 2/1984 | Nishimatsu et al. | 219/10.55 R |
| 4,576,692 | 3/1986 | Fukuta et al. | 204/165 |
| 4,736,304 | 4/1988 | Doehler | 364/469 |
| 4,831,963 | 5/1989 | Saito et al. | 118/723 |
| 4,898,118 | 2/1990 | Murakami et al. | 118/723 |
| 4,909,184 | 3/1990 | Fujiyama | 118/723 |
| 4,946,549 | 8/1990 | Bachman et al. | 156/643 |
| 4,960,071 | 10/1990 | Akahori et al. | 118/722 |
| 4,986,214 | 1/1991 | Zumoto et al. | 118/722 |
| 4,996,077 | 2/1991 | Moslehi et al. | 427/38 |
| 5,008,593 | 4/1991 | Schlie et al. | 315/39 |
| 5,082,517 | 1/1992 | Moslehi | 156/345 |
| 5,084,126 | 1/1992 | McKee | 156/645 |
| 5,111,111 | 5/1992 | Stevens et al. | 315/111.41 |
| 5,133,825 | 7/1992 | Hakamata et al. | 156/345 |
| 5,134,965 | 8/1992 | Tokuda et al. | 118/723 |
| 5,173,641 | 12/1992 | Imahashi et al. | 315/111.41 |
| 5,211,995 | 5/1993 | Kuehnle et al. | 427/570 |
| 5,234,526 | 8/1993 | Chen et al. | 156/345 |
| 5,234,529 | 8/1993 | Johnson | 156/345 |
| 5,266,364 | 11/1993 | Tamura et al. | 427/571 |
| 5,282,899 | 2/1994 | Balmashnov et al. | 118/723 R |
| 5,306,985 | 4/1994 | Berry | 315/111.41 |
| 5,364,519 | 11/1994 | Fujimura et al. | 204/298.38 |
| 5,387,288 | 2/1995 | Shatas | 118/723 |
| 5,405,492 | 4/1995 | Moslehi | 156/643 |
| 5,449,434 | 9/1995 | Hooke et al. | 216/70 |
| 5,462,602 | 10/1995 | Misiano et al. | 118/718 |
| 5,466,991 | 11/1995 | Berry | 315/111.41 |
| 5,489,362 | 2/1996 | Steinhardt et al. | 156/643.1 |
| 5,520,771 | 5/1996 | Kanai et al. | 156/345 |
| 5,540,812 | 7/1996 | Kadomura | 156/652.1 |
| 5,545,289 | 8/1996 | Chen et al. | 156/643.1 |
| 5,558,717 | 9/1996 | Zhao et al. | 118/715 |
| 5,567,241 | 10/1996 | Tsu et al. | 118/723 |
| 5,626,679 | 5/1997 | Shimizu et al. | 118/723 MR |

FOREIGN PATENT DOCUMENTS

0697467A1  2/1996  European Pat. Off. ........ C23C 16/44

Primary Examiner—Thi Dang
Assistant Examiner—Luz Alejandro
Attorney, Agent, or Firm—Townsend and Townsend and Crew

[57] ABSTRACT

An apparatus and methods for an upgraded CVD system providing a remote plasma for efficiently cleaning a chamber, according to a specific embodiment. Etching or depositing a layer onto a substrate also may be achieved using the upgraded CVD system of the present invention. In a specific embodiment, the present invention provides apparatus for an easily removable, conveniently handled, and relatively inexpensive, robust microwave plasma source as a retrofit for or a removable addition to existing CVD apparatus. The present invention provides an improved CVD apparatus or retrofit of existing CVD apparatus capable of producing a remote plasma for efficiently cleaning the chamber.

28 Claims, 11 Drawing Sheets

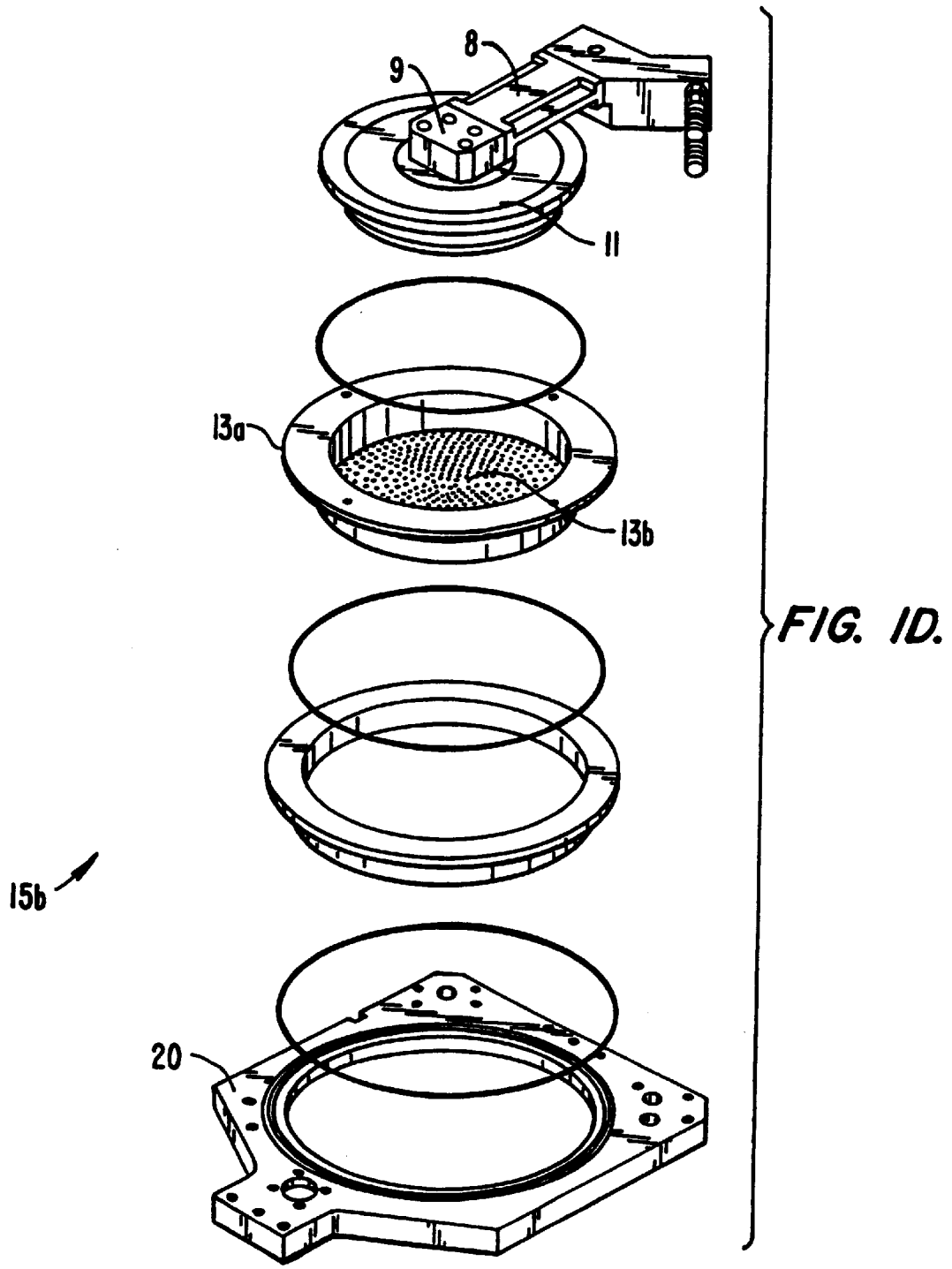

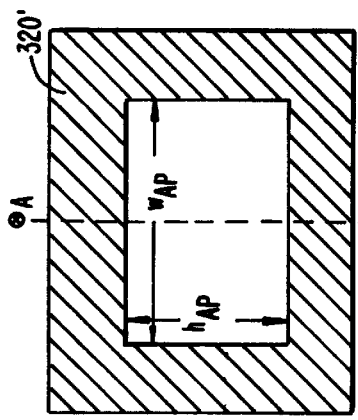
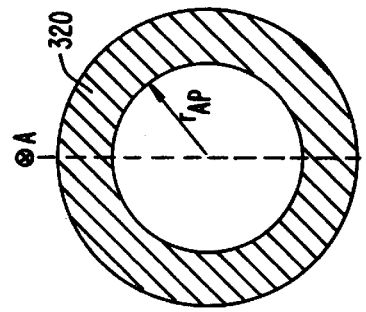
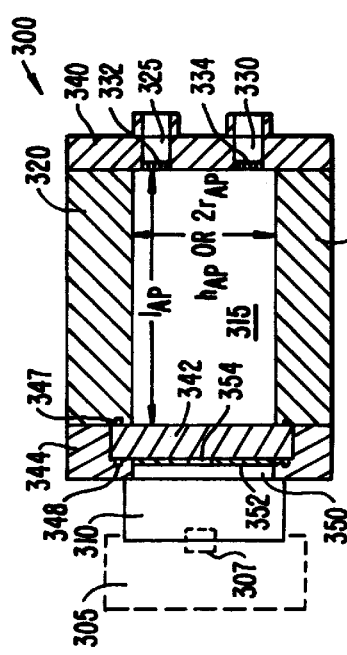
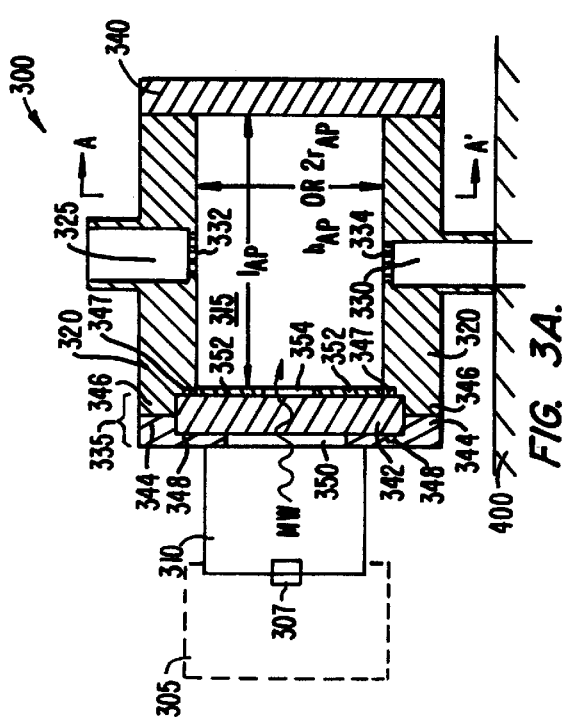

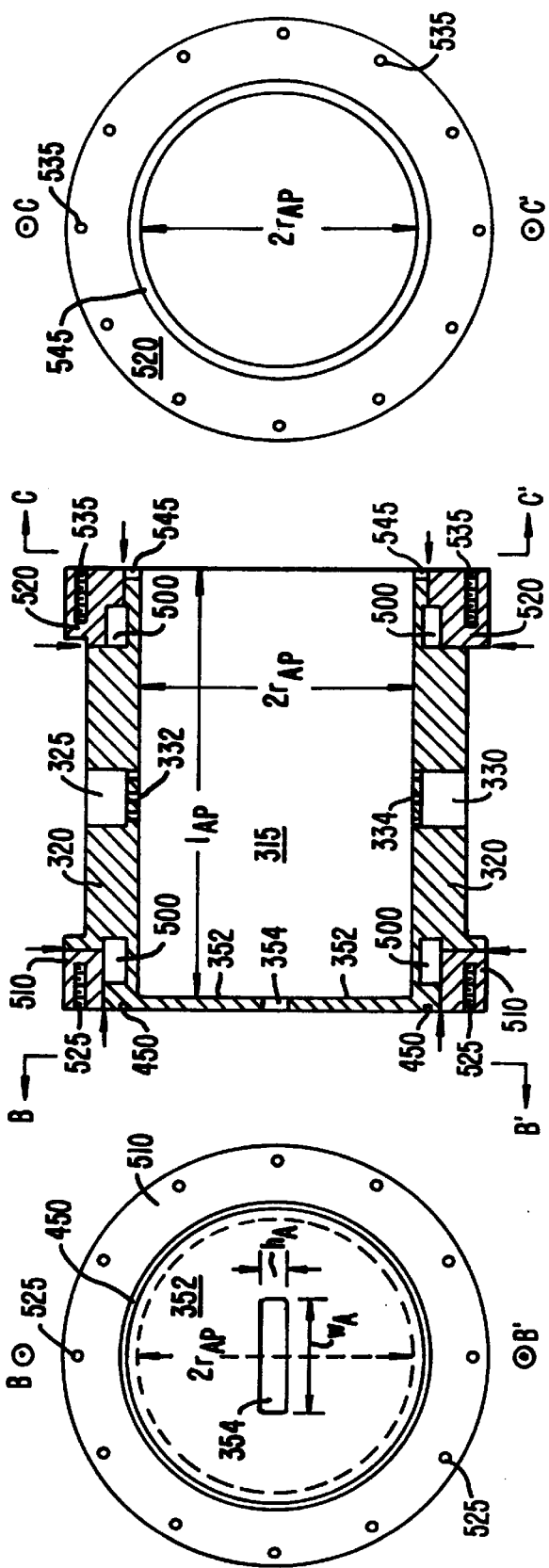

APPARATUS FOR IMPROVED REMOTE MICROWAVE PLASMA SOURCE FOR USE WITH SUBSTRATE PROCESSING SYSTEMS

CROSS REFERENCE TO RELATED APPLICATIONS

This application is related to a commonly assigned patent application Ser. No. 08/811,627 entitled "APPARATUS AND METHODS FOR UPGRADED SUBSTRATE PROCESSING SYSTEM WITH MICROWAVE PLASMA SOURCE", filed on Mar. 5, 1997 and having Tsutomu Tanaka, Mukul Kelkar, Kevin Fairbairn, Hari Ponnekanti and David Cheung listed as inventors, the disclosure of which is hereby incorporated by reference.

BACKGROUND OF THE INVENTION

The present invention relates to substrate processing. More specifically, the present invention relates to apparatus and methods for upgrading a substrate processing system. Some embodiments of the present invention are particularly useful for cleaning a chamber in a substrate processing system. However, other embodiments of the present invention also may be useful for etching or depositing films on a substrate processed in the substrate processing system.

One of the primary steps in the fabrication of modern semiconductor devices is the formation of a layer, such as a metal silicide layer like tungsten silicide ($WSi_x$), on a substrate or wafer. As is well known, such a layer can be deposited by chemical vapor deposition (CVD). In a conventional thermal CVD process, reactive gases are supplied to the substrate surface where heat-induced chemical reactions take place to form the desired film over the surface of the substrate being processed. In a conventional plasma-enhanced CVD (PECVD) process, a controlled plasma is formed using radio frequency (RF) energy or microwave energy to decompose and/or energize reactive species in reactant gases to produce the desired film.

One problem that arises during such CVD processes is that unwanted deposition occurs in the processing chamber and leads to potentially high maintenance costs. With CVD of a desired film on a wafer, undesired film deposition can occur on any hot surface including the heater or process kit parts of the apparatus, because the reactive gases can diffuse everywhere, even between cracks and around corners, in the processing chamber. During subsequent wafer depositions, this excess growth on the heater and/or other parts of the apparatus will accelerate until a continuous metal silicide film is grown on the heater and/or these other parts. Over time, failure to clean the residue from the CVD apparatus often results in degraded, unreliable processes and defective wafers. When excess deposition starts to interfere with the CVD system's performance, the heater and other process kit parts (such as the shadow ring and gas distribution faceplate) can be removed and replaced to remove unwanted accumulations in the CVD system. Depending on which and how many parts need replacing and the frequency of the replacement, the cost of maintaining the substrate processing system can become very high.

In these CVD processes, a reactive plasma cleaning is regularly performed in situ in the processing chamber to remove the unwanted deposition material from the chamber walls, heater, and other process kit parts of the processing chamber. Commonly performed between deposition steps for every wafer or every n wafers, this cleaning procedure is performed as a standard chamber cleaning operation where the etching gas is used to remove or etch the unwanted deposited material. Common etching techniques include plasma CVD techniques that promote excitation and/or disassociation of the reactant gases by the application of RF energy with capacitively-coupled electrodes to a reaction zone proximate the substrate surface. In these techniques, a plasma of highly reactive species is created that reacts with and etches away the unwanted deposition material from the chamber walls and other areas. However, with some metal CVD processes, etching gases useful for etching unwanted metal are often corrosive and attack the materials which make up the chamber, heater, and process kit parts of the processing chamber. Moreover, use of in situ plasma cleaning also causes ion bombardment of the metallic parts of the CVD apparatus, causing physical damage to the gas distribution manifold and the inside chamber walls. Therefore, in situ cleaning with these etching gases may make it difficult to effectively clean excess CVD film without also eventually damaging the heater and other chamber parts in the cleaning process. Thus, maintaining chamber performance may result in damage to expensive consumable items which need frequent replacement as a result. In addition to such in situ plasma cleaning procedures and occurring far less frequently, a second cleaning procedure (often referred to as a preventive maintenance cleaning) involves opening the processing chamber and physically wiping the entire reactor—including the chamber walls, exhaust and other areas having accumulated residue—with a special cloth and cleaning fluids. Without these frequent cleaning procedures, impurities from the build up in the CVD apparatus can migrate onto the wafer and cause device damage. Thus, properly cleaning CVD apparatus is important for the smooth operation of substrate processing, improved device yield and better product performance.

As an alternative to in situ plasma cleaning, other conventional CVD apparatus have a separate processing chamber connected to a remote microwave plasma system. Because the high breakdown efficiency with a microwave plasma results in a higher etch rate (on the order of about 2 $\mu$m/min) than is obtained with a capacitive RF plasma, these remote microwave plasma systems provide radicals from the remote plasma that can more gently, efficiently and adequately clean the residue without ion bombardment.

However, these conventional remote microwave plasma systems often require expensive and fragile equipment for operation. FIG. 5 illustrates an exemplary remote microwave plasma system according to the prior art. In many of these conventional CVD apparatus, the remote microwave plasma system includes a ceramic plasma applicator tube 601, a conventional magnetron 603 (coupled to a power source, not shown) with an antenna 604, isolator (not shown), ultra-violet (UV) lamp 605 with power supply 607, and bulky waveguide system 609 with tuning assembly (not shown). Ceramic applicator tube 601 includes a gas inlet 613 connected to a gas source (not shown) for introduction of a reactive gas into the tube 601, where microwaves passing through the portion of tube disposed within a portion of waveguide 611 radiate the reactive gas, which is ignited by UV lamp 605 to form a plasma in a space 613a. Radicals exit an outlet 615 of ceramic tube 601 that is connected to a downstream processing chamber. Such conventional remote microwave plasma systems produce plasma in the relatively small physical space 613 (for example, about a two-inch lengthwise section of a ceramic applicator tube having about a 1 inch diameter) in the ceramic applicator tube 601, having a total length of about 18–24 inches, which is disposed through a portion of the waveguide 611 in waveguide system 609. The plasma formed in this small space 613a of the ceramic applicator tube 601 by magnetrons using high power supplies has a high plasma density and requires expensive, high power density, direct current (DC) microwave power supplies in order to obtain sufficiently high microwave coupling efficiency. Since the plasma formed in small space 613*a* has such a high plasma density, the ceramic applicator tube 601 often becomes very hot. Such ceramic applicator tubes, which are subject to cracking and breakage after repeated thermal cycling, can be expensive to replace. Additionally, some of these conventional remote plasma sources may require a UV lamp or a microwave source with very high wattage (on the order of 3 kilowatts (kW)) in order to ignite the plasma.

From the above, it can be seen that it is desirable to have an economic, robust remote microwave plasma system that permits efficient cleaning of a downstream substrate processing apparatus. It is also desirable to provide a remote microwave plasma system that provides more efficient generation of reactive radicals for cleaning the downstream substrate processing apparatus. A relatively inexpensive, yet high quality, remote microwave plasma source that may be a removable addition to or a retrofit of existing substrate processing apparatus, is needed in order to upgrade performance of the apparatus for improved cleaning ability while minimizing costs.

SUMMARY OF THE INVENTION

The present invention provides an apparatus for an improved remote microwave plasma system for use with a downstream substrate processing system. The apparatus provides a microwave-generated plasma that may be used to provide efficient cleaning of the downstream substrate processing system, according to a specific embodiment. Etching or depositing a layer onto a substrate in the downstream substrate processing system may also be achieved using the apparatus of the present invention according to other embodiments. In a specific embodiment, the present invention provides an efficient, robust, relatively inexpensive microwave plasma system as a retrofit for or a removable addition onto existing substrate processing apparatus. In another embodiment, the present invention provides an improved substrate processing apparatus or retrofit of existing apparatus capable of efficiently cleaning the substrate processing apparatus.

According to one specific embodiment, the present invention provides apparatus for a remote microwave plasma system for use with a substrate processing apparatus. The apparatus includes a plasma applicator defining a volume. The plasma applicator includes a conductive applicator body, a first end wall and a second end wall opposite the first end wall. The first end wall includes a microwave-transparent plate. The plasma applicator further includes a gas inlet for receiving a reactive gas into all of the volume of the plasma applicator. The plasma applicator also includes an outlet. The plasma applicator receives, through the microwave-transparent plate, microwaves that form a plasma in the volume from the reactive gas energized by the microwaves in the plasma applicator to discharge via the outlet radicals from the plasma for use in a substrate processing apparatus located downstream from the apparatus.

According to another embodiment, the present invention provides an improved substrate processing system. This system includes a processing chamber, a gas delivery system configured to deliver a reactive gas to the processing chamber, and a heating system including a pedestal in the processing chamber that is for holding a substrate and heating to a selected temperature. The improved substrate processing system also includes a vacuum system configured to set and maintain a selected pressure within the processing chamber. The remote microwave plasma system includes a conductive plasma applicator defining an internal volume. The applicator includes a first end wall, a conductive second end wall opposite the first end wall, a gas inlet and an outlet. The first end wall includes a microwave-transparent plate. The gas inlet and the outlet are equipped with microwave arrestors according to a specific embodiment. The gas inlet is for receiving a reactive gas into the internal volume of the plasma applicator. The microwave system is coupled to a flanged microwave-transparent plate forming part of the first end wall. The internal volume is for containing microwaves introduced through the microwave-transparent plate, and the microwaves ignite and maintain a plasma from the reactive gas. Radicals formed from the plasma exit the outlet of the plasma applicator to enter the processing chamber.

These and other embodiments of the present invention, as well as its advantages and features are described in more detail in conjunction with the text below and attached figures.

BRIEF DESCRIPTION OF THE DRAWINGS

FIGS. 1C and 1D are exploded perspective views of parts of the CVD chamber depicted in FIG. 1A;

FIG. 3A is a cross-sectional side lengthwise view of a remote microwave plasma source module 300 according to a specific embodiment of the present invention;

FIG. 3B is a cross-sectional side transverse plane view along line A–A' of one embodiment of module 300 of FIG. 3A utilizing a rectangular plasma applicator, according to one embodiment of the present invention;

FIG. 3C is a cross-sectional side transverse plane view along line A–A' of another embodiment of module 300 of FIG. 3A utilizing a cylindrical plasma applicator, according to another embodiment of the present invention;

FIG. 3D is a cross-sectional side lengthwise view of a remote microwave plasma source module 300 according to another specific embodiment of the present invention;

FIG. 4A is a cross-sectional side lengthwise view of a cylindrical plasma applicator used in an embodiment of module 300, according to a specific embodiment of the present invention;

FIG. 4B is a plane view of one end of the cylindrical plasma applicator shown in FIG. 4A, according to the specific embodiment of the present invention;

FIG. 4C is a plane view of the other end of the cylindrical plasma applicator shown in FIG. 4A, according to the specific embodiment of the present invention.

DETAILED DESCRIPTION OF THE SPECIFIC EMBODIMENTS

I. Exemplary CVD System

Figure 1A:
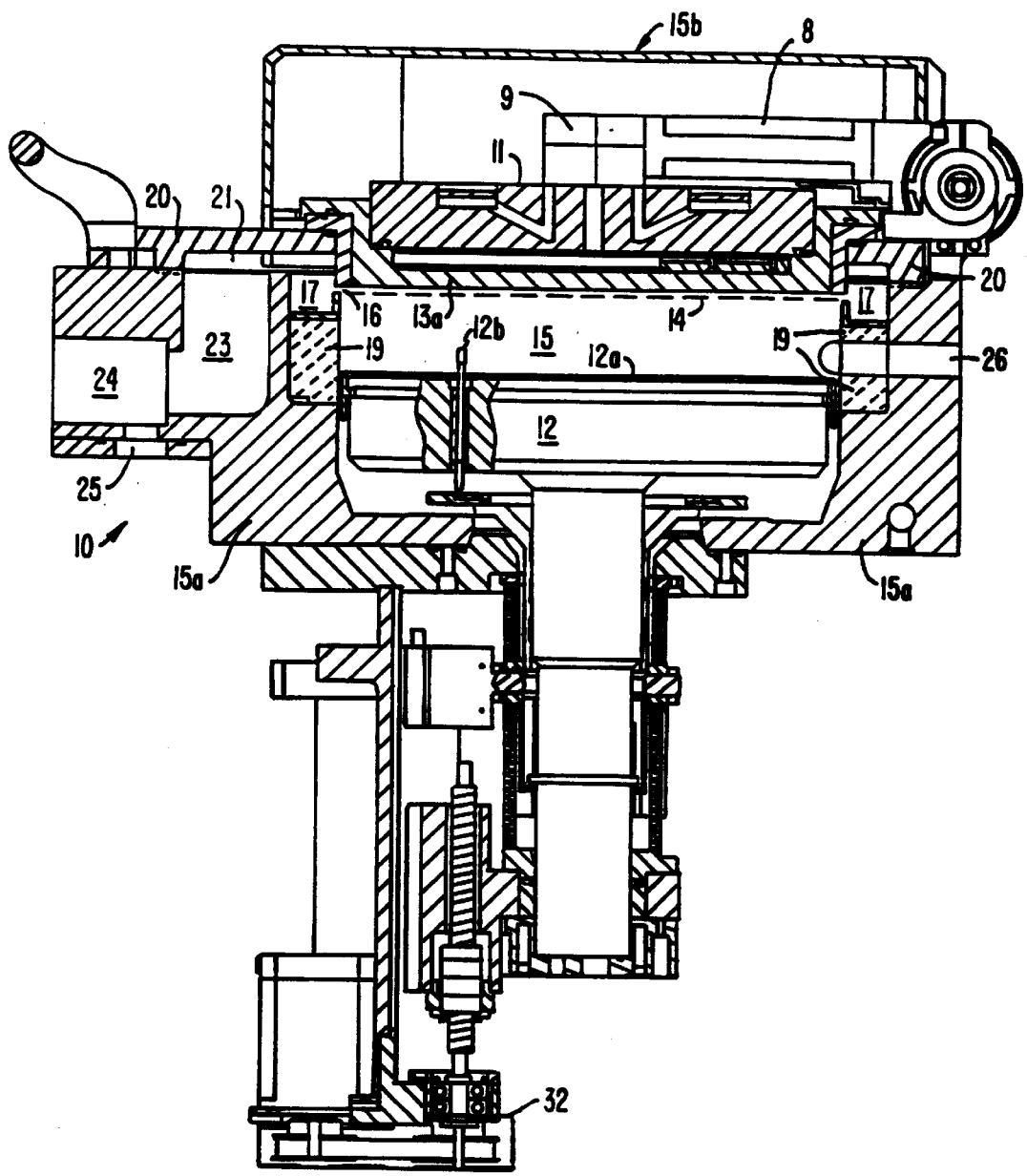
FIGS. 1A and 1B are vertical, cross-sectional views of one embodiment of an exemplary substrate processing apparatus, such as a CVD apparatus, which may be used in accordance with the present invention.
Figure 1B:
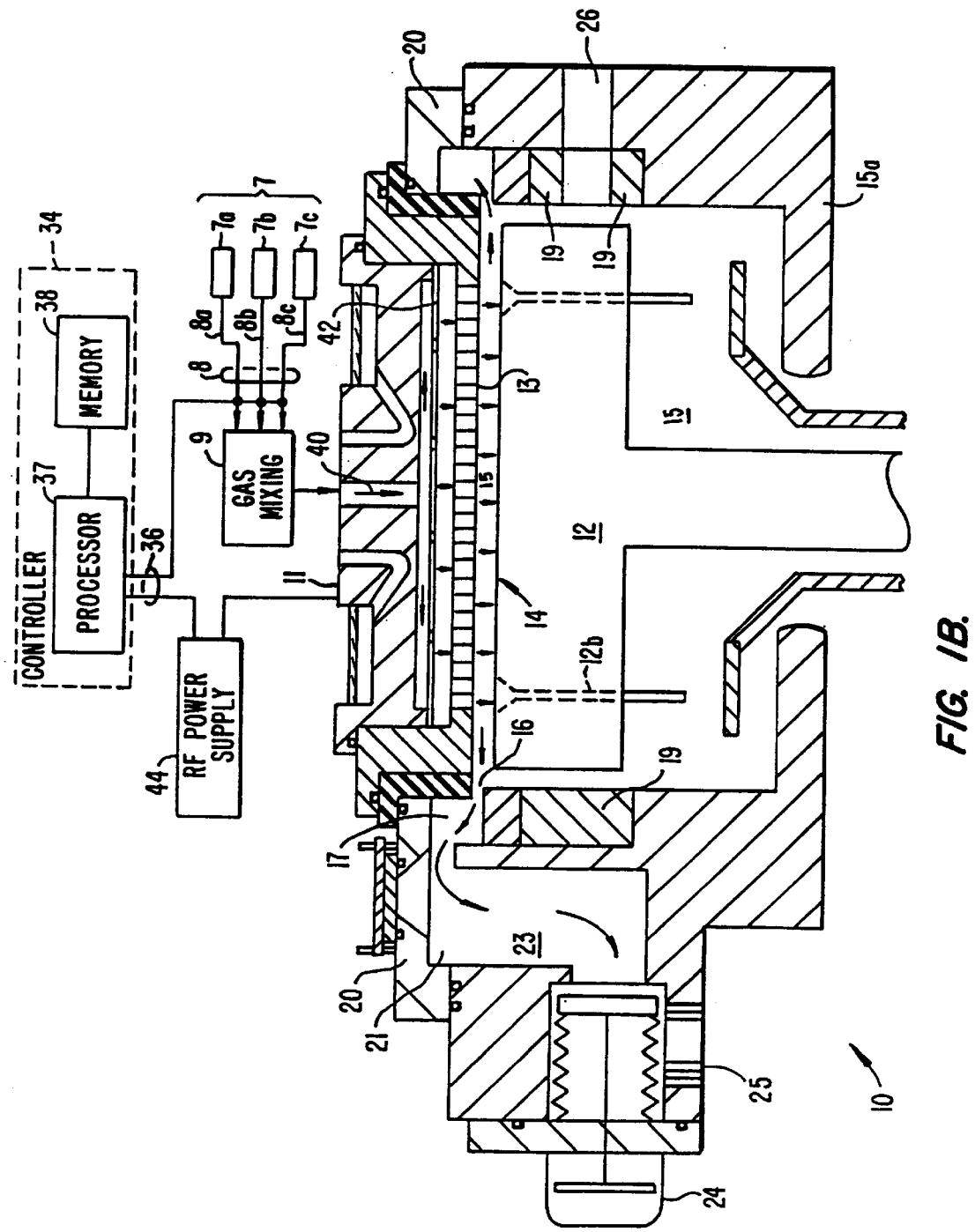
Figure 1C:
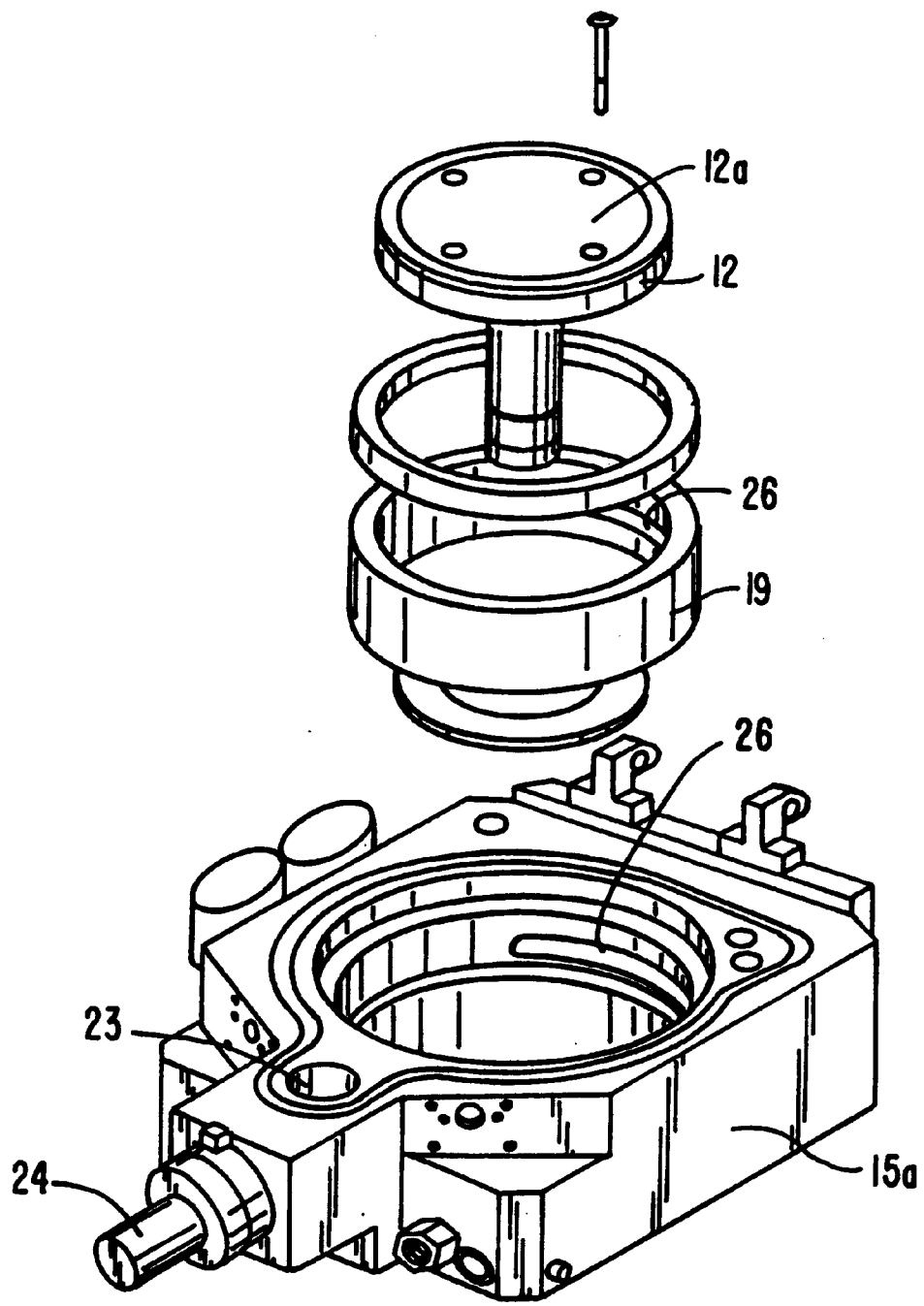

Specific embodiments of the present invention may be used with or retrofitted onto a variety of chemical vapor deposition (CVD) or other types of substrate processing apparatus. One suitable substrate processing apparatus with which the present invention can be used or retrofitted is shown in FIGS. 1A and 1B, which are vertical, cross-sectional views of a CVD system 10, having a vacuum or processing chamber 15 that includes a chamber wall 15a and chamber lid assembly 15b. Chamber wall 15a and chamber lid assembly 15b are shown in exploded, perspective views in FIGS. 1C and 1D.

Reactor 10 contains a gas distribution manifold 11 for dispersing process gases to a substrate (not shown) that rests on a resistively-heated pedestal 12 centered within the process chamber. During processing, the substrate (e.g. a semiconductor wafer) is positioned on a flat (or slightly convex) surface 12a of pedestal 12. Preferably having a surface of ceramic such as aluminum nitride, pedestal 12 can be moved controllably between a lower loading/off-loading position (depicted in FIG. 1A) and an upper processing position (indicated by dashed line 14 in FIG. 1A and shown in FIG. 1B), which is closely adjacent to manifold 11. A centerboard (not shown) includes sensors for providing information on the position of the wafers.

Deposition and carrier gases are introduced into chamber 15 through perforated holes 13b (FIG. 1D) of a conventional flat, circular gas distribution face plate 13a. More specifically, deposition process gases flow (indicated by arrow 40 in FIG. 1B) into the chamber through the inlet manifold 11, through a conventional perforated blocker plate 42 and then through holes 13b in gas distribution faceplate 13a.

Before reaching the manifold, deposition and carrier gases are input from gas sources 7 through gas supply lines 4 (FIG. 1B) into a gas mixing block or system 9 where they are combined and then sent to manifold 11. It is also possible, and desirable in some instances, to direct deposition and carrier gases directly from supply lines 8 to manifold 11. In such a case, gas mixing system 9 is bypassed. In other situations, any of gas lines 8 may bypass gas mixing system 9 and introduce gases through passages (not shown) in the bottom of chamber 12. As shown in FIG. 1B, there are three gas supply lines 8 in a specific embodiment to deposit $WSi_x$. A first line 8a supplies a silicon-containing gas (e.g., dichlorosilane ($SiH_2Cl_2$) referred to as "DCS" from a DCS source from gas source 7a) into gas mixing system 9, while a second line 8b supplies a tungsten-containing gas (e.g., tungsten hexafluoride ($WF_6$) from a $WF_6$ source from gas source 7b) into gas mixing system 9. For each line 8a and 8b, a carrier gas (e.g., argon from argon sources in gas sources 7a and 7b) can be supplied with the process to stabilize gas flows as appropriate and to even the gas flow between the two lines into mixing system 9. Such mixing of gases (DCS and $WF_6$) upstream of chamber 15 is believed to result in more uniform gas distribution into the chamber, thereby resulting in greater uniformity in the deposited $WSi_x$ film. A third supply line 8c introduces an inert purge gas (e.g., argon from a gas source 7c) from the bottom of the chamber to keep deposition gases away from the area of the chamber below heater 12. In some preferred embodiments, an additional silicon source (e.g., silane ($SiH_4$) from source 7a may be supplied to gas line 8a.

Generally, the supply line for each process gas includes (i) several safety shut-off valves (not shown) that can be used to automatically or manually shut off the flow of process gas into the chamber, and (ii) mass flow controllers (MFCs) (also not shown) that measure the flow of gas through the supply line. When toxic gases are used in the process, the several safety shut-off valves are positioned on each gas supply line in conventional configurations.

The deposition process performed in reactor 10 can be either a thermal process or a plasma-enhanced process. In a plasma-enhanced process, an RF power supply 44 applies electrical power between the gas distribution faceplate 13a and pedestal 12 to excite the process gas mixture to form a plasma within the cylindrical region between the faceplate 13a and pedestal 12. (This region will be referred to herein as the "reaction region"). Constituents of the plasma react to deposit a desired film on the surface of the semiconductor wafer supported on pedestal 12. RF power supply 44 can be a mixed frequency RF power supply that typically supplies power at a high RF frequency (RF1) of 13.56 Megahertz (MHz) and at a low RF frequency (RF2) of 360 kilohertz (kHz) to enhance the decomposition of reactive species introduced into the vacuum chamber 15. Of course, RF power supply 44 can supply either single- or mixed-frequency RF power (or other desired variations) to manifold 11 to enhance the decomposition of reactive species introduced into chamber 15. In a thermal process, RF power supply 44 is not utilized, and the process gas mixture thermally reacts to deposit the desired film on the surface of the semiconductor wafer supported on pedestal 12, which is resistively heated to provide the thermal energy needed for the reaction.

During a plasma-enhanced deposition process, the plasma heats the entire reactor 10, including the walls of the chamber body 15a surrounding the exhaust passageway 23 and the shut-off valve 24. During a thermal deposition process, heated pedestal 12 causes heating of reactor 10. When the plasma is not turned on, or during a thermal deposition process, a hot liquid is circulated through the walls 15a of reactor 10 to maintain the chamber at an elevated temperature. Fluids used to heat the chamber walls 15a include the typical fluid types, i.e., water-based ethylene glycol or oil-based thermal transfer fluids. This heating beneficially reduces or eliminates condensation of undesirable reactant products and improves the elimination of volatile products of the process gases and contaminants that might otherwise condense on the walls of cool vacuum passages and migrate back into the processing chamber during periods of no gas flow.

The remainder of the gas mixture that is not deposited in a layer, including reaction products, is evacuated from the chamber by a vacuum pump (not shown). Specifically the gases are exhausted through an annular, slot-shaped orifice 16 surrounding the reaction region and into an annular exhaust plenum 17. The annular slot 16 and the plenum 17 are defined by the gap between the top of the chamber's cylindrical side wall 15a (including the upper dielectric lining 19 on the wall) and the bottom of the circular chamber lid 20. The 360° circular symmetry and uniformity of the slot orifice 16 and the plenum 17 are important to achieving a uniform flow of process gases over the wafer so as to deposit a uniform film on the wafer.

The gases flow underneath a lateral extension portion 21 of the exhaust plenum 17, past a viewing port (not shown), through a downward-extending gas passage 23, past a vacuum shut-off valve 24 (whose body is integrated with the lower chamber wall 15a), and into the exhaust outlet 25 that connects to the external vacuum pump (not shown) through a foreline (also not shown).

The wafer support platter of resistively-heated pedestal 12 is heated using an embedded single-loop embedded heater element configured to make two full turns in the form of parallel concentric circles. An outer portion of the heater element runs adjacent to a perimeter of the support platter, while an inner portion runs on the path of a concentric circle having a smaller radius. The wiring to the heater element passes through the stem of pedestal 12. Pedestal 12 may be made of material including aluminum, ceramic, or some combination thereof.

Typically, any or all of the chamber lining, gas inlet manifold faceplate, and various other reactor hardware are made out of material such as aluminum, anodized aluminum, or ceramic. An example of such CVD apparatus is described in commonly assigned U.S. Pat. No. 5,558,717 entitled "CVD Processing Chamber," issued to Zhao et al., hereby incorporated by reference in its entirety.

A lift mechanism and motor 32 (FIG. 1A) raises and lowers the heater pedestal assembly 12 and its wafer lift pins 12b as wafers are transferred by a robot blade (not shown) into and out of the body of the chamber through an insertion/removal opening 26 in the side of the chamber 10. The motor 32 raises and lowers pedestal 12 between a processing position 14 and a lower wafer-loading position. The motor, valves or flow controllers connected to the supply lines 8, gas delivery system, throttle valve, RF power supply 44, and chamber and substrate heating systems are all controlled by a system controller 34 (FIG. 1B) over control lines 36, of which only some are shown. Controller 34 relies on feedback from optical sensors to determine the position of movable mechanical assemblies such as the throttle valve and pedestal which are moved by appropriate motors controlled by controller 34.

In a preferred embodiment, the system controller includes a hard disk drive (memory 38), a floppy disk drive and a processor 37. The processor contains a single-board computer (SBC), analog and digital input/output boards, interface boards and stepper motor controller boards. Various parts of CVD system 10 conform to the Versa Modular European (VME) standard which defines board, card cage, and connector dimensions and types. The VME standard also defines the bus structure as having a 16-bit data bus and a 24-bit address bus.

System controller 34 controls all of the activities of the CVD machine. The system controller executes system control software, which is a computer program stored in a computer-readable medium such as a memory 38. Preferably, memory 38 is a hard disk drive, but memory 38 may also be other kinds of memory. The computer program includes sets of instructions that dictate the timing, mixture of gases, chamber pressure, chamber temperature, RF power levels, pedestal position, and other parameters of a particular process. Other computer programs stored on other memory devices including, for example, a floppy disk or other another appropriate drive, may also be used to operate controller 34.

Figure 1E:
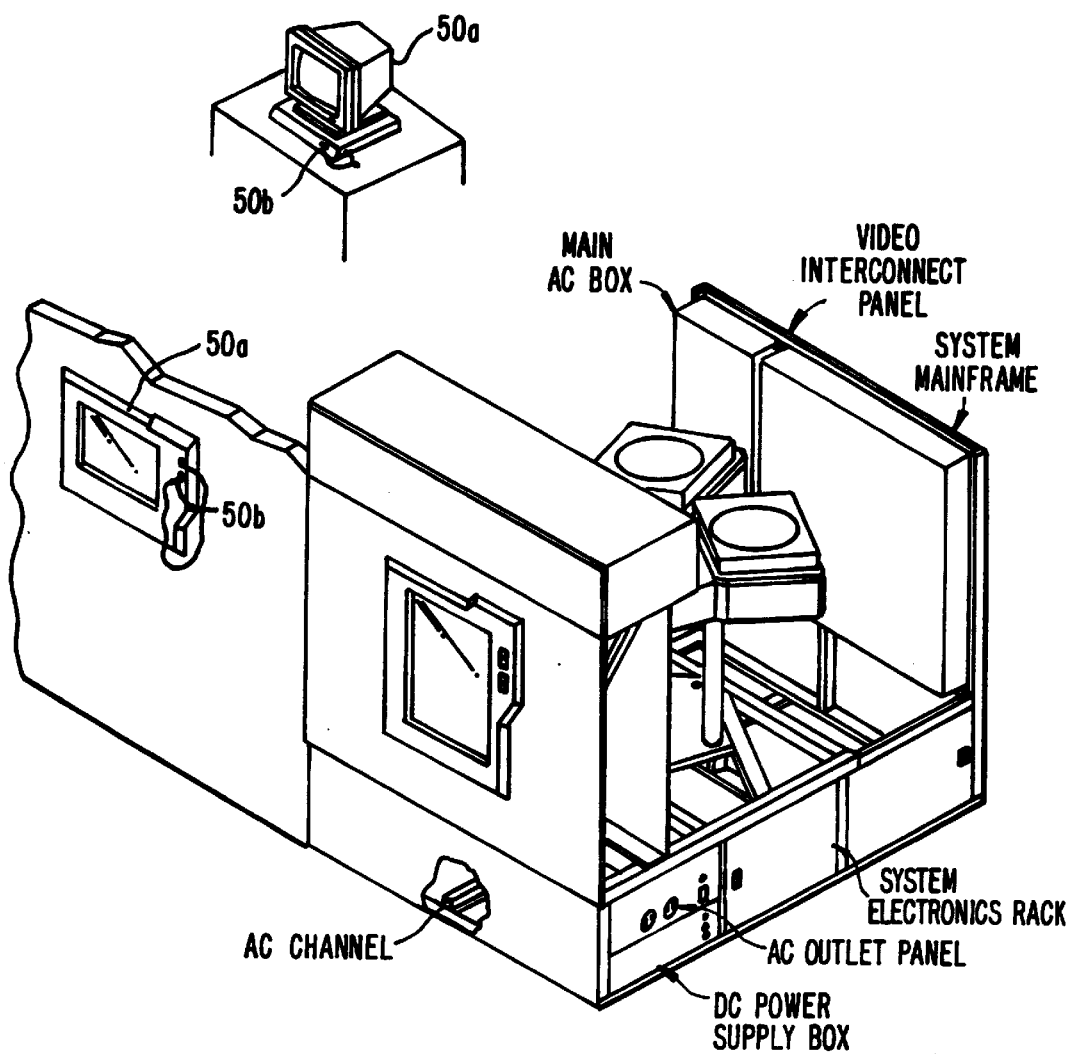
FIG. 1E is a simplified diagram of system monitor and CVD system 10 in a system which may include one or more chambers.

The interface between a user and controller 34 is via a CRT monitor 50a and light pen 50b, shown in FIG. 1E, which is a simplified diagram of the system monitor and CVD system 10 in a substrate processing system, which may include one or more chambers. In the preferred embodiment two monitors 50a are used, one mounted in the clean room wall for the operators and the other behind the wall for the service technicians. The monitors 50a simultaneously display the same information, but only one light pen 50b is enabled. A light sensor in the tip of light pen 50b detects light emitted by CRT display. To select a particular screen or function, the operator touches a designated area of the display screen and pushes the button on the pen 50b. The touched area changes its highlighted color, or a new menu or screen is displayed, confirming communication between the light pen and the display screen. Other devices, such as a keyboard, mouse, or other pointing or communication device, may be used instead of or in addition to light pen 50b to allow the user to communicate with controller 34.

The process for depositing the film can be implemented using a computer program product that is executed by controller 34. The computer program code can be written in any conventional computer readable programming language: for example, 68000 assembly language, C, C++, Pascal, Fortran or others. Suitable program code is entered into a single file, or multiple files, using a conventional text editor and stored or embodied in a computer-usable medium, such as a memory system of the computer. If the entered code text is in a high level language, the code is compiled, and the resultant compiler code is then linked with an object code of precompiled Windows™ library routines. To execute the linked, compiled object code the system user invokes the object code, causing the computer system to load the code in memory. The CPU then reads and executes the code to perform the tasks identified in the program.

Figure 1F:
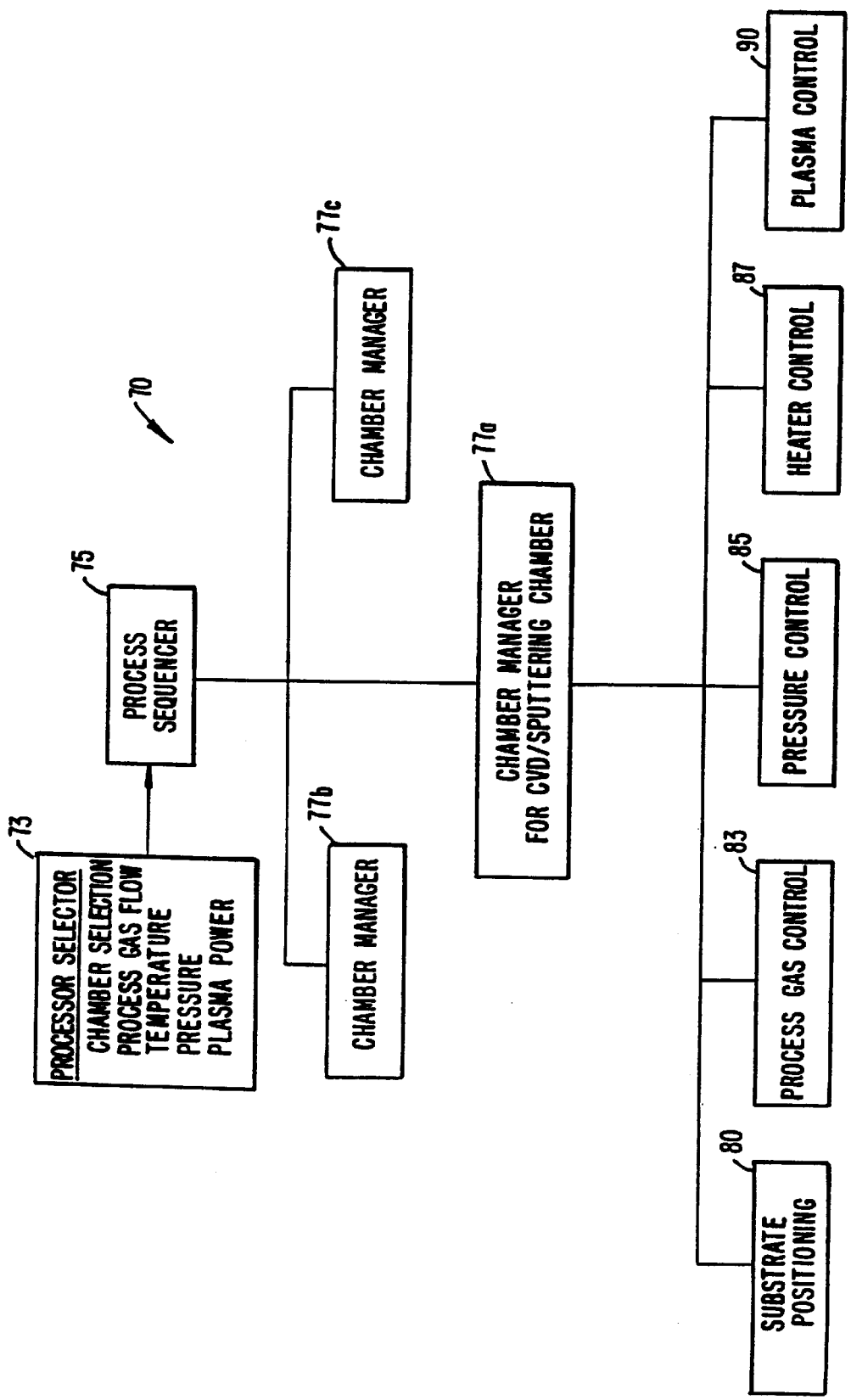
FIG. 1F shows an illustrative block diagram of the hierarchical control structure of the system control software, computer program 70, according to a specific embodiment.

FIG. 1F is an illustrative block diagram of the hierarchical control structure of the system control software, computer program 70, according to a specific embodiment. Using the light pen interface, a user enters a process set number and process chamber number into a process selector subroutine 73 in response to menus or screens displayed on the CRT monitor. The process sets are predetermined sets of process parameters necessary to carry out specified processes, and are identified by predefined set numbers. The process selector subroutine 73 identifies (i) the desired process chamber and (ii) the desired set of process parameters needed to operate the process chamber for performing the desired process. The process parameters for performing a specific process relate to process conditions such as, for example, process gas composition and flow rates, temperature, pressure, plasma conditions such as microwave power levels or RF power levels and the low frequency RF frequency, cooling gas pressure, and chamber wall temperature. These parameters are provided to the user in the form of a recipe and are entered utilizing the light pen/CRT monitor interface.

The signals for monitoring the process are provided by the analog and digital input boards of the system controller, and the signals for controlling the process are output on the analog and digital output boards of CVD system 10. A process sequencer subroutine 75 comprises program code for accepting the identified process chamber and set of process parameters from the process selector subroutine 73 and for controlling operation of the various process chambers. Multiple users can enter process set numbers and process chamber numbers, or a user can enter multiple process, set numbers and process chamber number, so the sequencer subroutine 75 operates to schedule the selected processes in the desired sequence. Preferably, the sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 75 takes into consideration the present condition of the process chamber being used in comparison with the desired process conditions for a selected process, or the "age" of each particular user entered request, or any other relevant factor a system programmer desires to include for determining scheduling priorities.

Once the sequencer subroutine 75 determines which process chamber and process set combination is going to be executed next, the sequencer subroutine 75 initiates execution of the process set by passing the particular process set parameters to a chamber manager subroutine 77a–c, which controls multiple processing tasks in a process chamber 15 according to the process set determined by the sequencer subroutine 75. For example, the chamber manager subroutine 77a comprises program code for controlling sputtering and CVD process operations in the process chamber 15. The chamber manager subroutine 77 also controls execution of various chamber component subroutines that control operation of the chamber components necessary to carry out the selected process set. Examples of chamber component subroutines are substrate positioning subroutine 80, process gas control subroutine 83, pressure control subroutine 85, heater control subroutine 87, and plasma control subroutine 90. Those having ordinary skill in the art will readily recognize that other chamber control subroutines can be included depending on what processes are to be performed in the process chamber 15. In operation, the chamber manager subroutine 77a selectively schedules or calls the process component subroutines in accordance with the particular process set being executed. The chamber manager subroutine 77a schedules the process component subroutines much like the sequencer subroutine 75 schedules which process chamber 15 and process set are to be executed next. Typically, the chamber manager subroutine 77a includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIG. 1F. The substrate positioning subroutine 80 comprises program code for controlling chamber components that are used to load the substrate onto pedestal 12 and, optionally, to lift the substrate to a desired height in the chamber 15 to control the spacing between the substrate and the gas distribution manifold 11. When a substrate is loaded into the process chamber 15, pedestal 12 is lowered to receive the substrate, and thereafter, pedestal 12 is raised to the desired height in the chamber, to maintain the substrate at a first distance or spacing from the gas distribution manifold during the CVD process. In operation, the substrate positioning subroutine 80 controls movement of pedestal 12 in response to process set parameters related to the support height that are transferred from the chamber manager subroutine 77a.

The process gas control subroutine 83 has program code for controlling process gas composition and flow rates. The process gas control subroutine 83 controls the open/close position of the safety shut-off valves, and also ramps up/down the mass flow controllers to obtain the desired gas flow rate. The process gas control subroutine 83 is invoked by the chamber manager subroutine 77a, as are all chamber component subroutines, and receives from the chamber manager subroutine process parameters related to the desired gas flow rates. Typically, the process gas control subroutine 83 operates by opening the gas supply lines and repeatedly (i) reading the necessary mass flow controllers, (ii) comparing the readings to the desired flow rates received from the chamber manager subroutine 77a, and (iii) adjusting the flow rates of the gas supply lines as necessary. Furthermore, the process gas control subroutine 83 includes steps for monitoring the gas flow rates for unsafe rates and for activating the safety shut-off valves when an unsafe condition is detected.

In some processes, an inert gas such as helium or argon is flowed into the chamber 15 to stabilize the pressure in the chamber before reactive process gases are introduced. For these processes, the process gas control subroutine 83 is programmed to include steps for flowing the inert gas into the chamber 15 for an amount of time necessary to stabilize the pressure in the chamber, and then the steps described above would be carried out. Additionally, if a process gas is to be vaporized from a liquid precursor, for example, tetra-ethylorthosilicate ("TEOS"), the process gas control subroutine 83 is written to include steps for bubbling a delivery gas, such as helium, through the liquid precursor in a bubbler assembly or introducing a carrier gas, such as helium or nitrogen, to a liquid injection system. When a bubbler is used for this type of process, the process gas control subroutine 83 regulates the flow of the delivery gas, the pressure in the bubbler, and the bubbler temperature in order to obtain the desired process gas flow rates. As discussed above, the desired process gas flow rates are transferred to the process gas control subroutine 83 as process parameters. Furthermore, the process gas control subroutine 83 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 85 comprises program code for controlling the pressure in the chamber 15 by regulating the size of the opening of the throttle valve in the exhaust system of the chamber. The size of the opening of the throttle valve is set to control the chamber pressure to the desired level in relation to the total process gas flow, size of the process chamber, and pumping set-point pressure for the exhaust system. When the pressure control subroutine 85 is invoked, the target pressure level is received as a parameter from the chamber manager subroutine 77a. The pressure control subroutine 85 operates to measure the pressure in the chamber 15 by reading one or more conventional pressure manometers connected to the chamber, to compare the measured value(s) to the target pressure, to obtain PID (proportional, integral, and differential) values from a stored pressure table corresponding to the target pressure, and to adjust the throttle valve according to the PID values obtained from the pressure table. Alternatively, the pressure control subroutine 85 can be written to open or close the throttle valve to a particular opening size to regulate the chamber 15 to the desired pressure.

The heater control subroutine 87 comprises program code for controlling the current to a heating unit that is used to heat the substrate 20. The heater control subroutine 87 is also invoked by the chamber manager subroutine 77a and receives a target, or set-point, temperature parameter. The heater control subroutine 87 measures the temperature by measuring voltage output of a thermocouple located in a pedestal 12, comparing the measured temperature to the set-point temperature, and increasing or decreasing current applied to the heating unit to obtain the set-point temperature. The temperature is obtained from the measured voltage by looking up the corresponding temperature in a stored conversion table or by calculating the temperature using a fourth-order polynomial. When an embedded loop is used to heat pedestal 12, the heater control subroutine 87 gradually controls a ramp up/down of current applied to the loop. Additionally, a built-in fail-safe mode can be included to detect process safety compliance, and can shut down operation of the heating unit if the process chamber 15 is not properly set up.

The plasma control subroutine 90 comprises program code for setting the low and high frequency RF power levels applied to the process electrodes in the chamber 15, and for setting the low frequency RF frequency employed. Plasma control subroutine 90 also includes program code for turning on and setting/adjusting the power levels applied to the magnetron or other microwave source used in the present invention. Similarly to the previously described chamber component subroutines, the plasma control subroutine 90 is invoked by the chamber manager subroutine 77a.

The above reactor description is mainly for illustrative purposes, and other equipment such as electron cyclotron resonance (ECR) plasma CVD devices, induction coupled RF high density plasma CVD devices, or the like may be used with the present invention to provide upgraded apparatus. Additionally, variations of the above-described system, such as variations in pedestal design, heater design, RF power frequencies, location of RF power connections and others are possible. For example, the wafer could be supported and heated by quartz lamps. It should be recognized that the present invention is not necessarily limited to use with or retrofitting of any specific apparatus.

II. Exemplary Structures

Figure 2A:
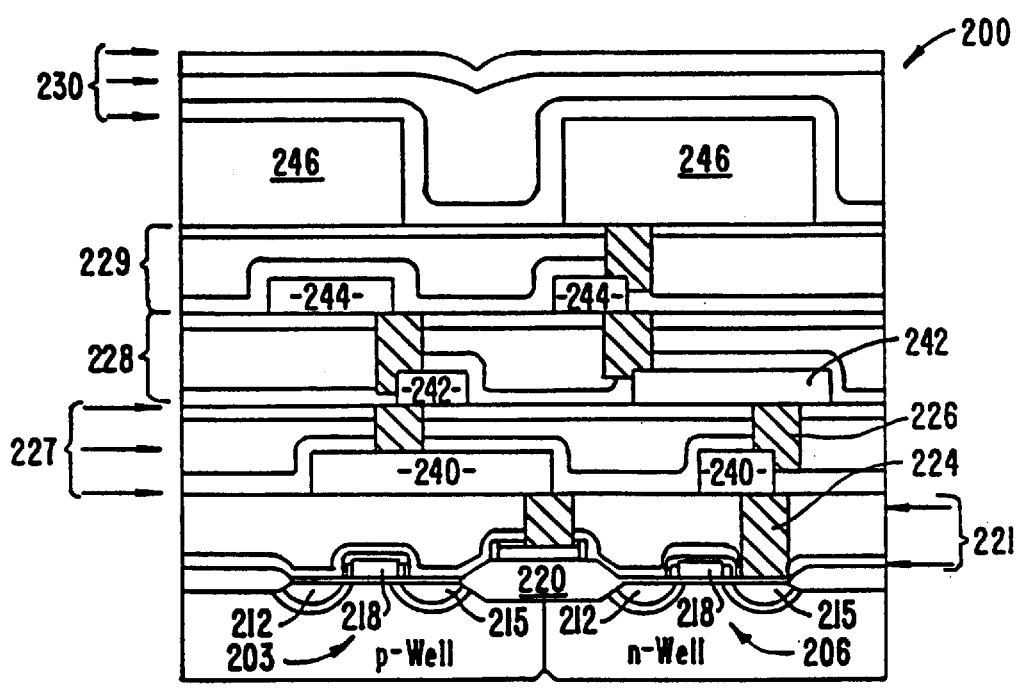
FIG. 2A is a simplified cross-sectional view of a semiconductor device manufactured in accordance with a specific embodiment of the present invention.

FIG. 2A illustrates a simplified cross-sectional view of an integrated circuit 200 which may be made in accordance with use of the present invention. As shown, integrated circuit 200 includes NMOS and PMOS transistors 203 and 206, which are separated and electrically isolated from each other by a field oxide region 220 formed by local oxidation of silicon (LOCOS), or other technique. Alternatively, transistors 203 and 206 may be separated and electrically isolated from each other by trench isolation (not shown) when transistors 203 and 206 are both NMOS or both PMOS. Each transistor 203 and 206 comprises a source region 212, a drain region 215 and a gate region 218.

A premetal dielectric (PMD) layer 221 separates transistors 203 and 206 from metal layer 240 with connections between metal layer 240 and the transistors made by contacts 224. Metal layer 240 is one of four metal layers, 240, 242, 244 and 246, included in integrated circuit 200. Each metal layer 240, 242, 244, and 246 is separated from adjacent metal layers by respective inter-metal dielectric (IMD) layers 227, 228, or 229. Adjacent metal layers are connected at selected openings by vias 226. Deposited over metal layer 246 are planarized passivation layers 230.

Figure 2B:
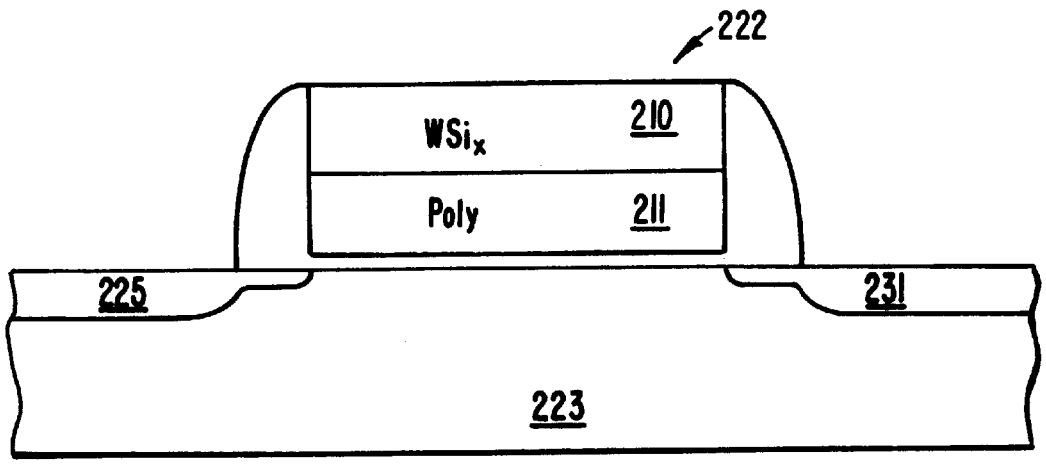
FIGS. 2B and 2C are simplified cross-sectional views of integrated circuit structures that incorporate $WSi_x$ layers in accordance with a specific embodiment of the present invention.
Figure 2C:
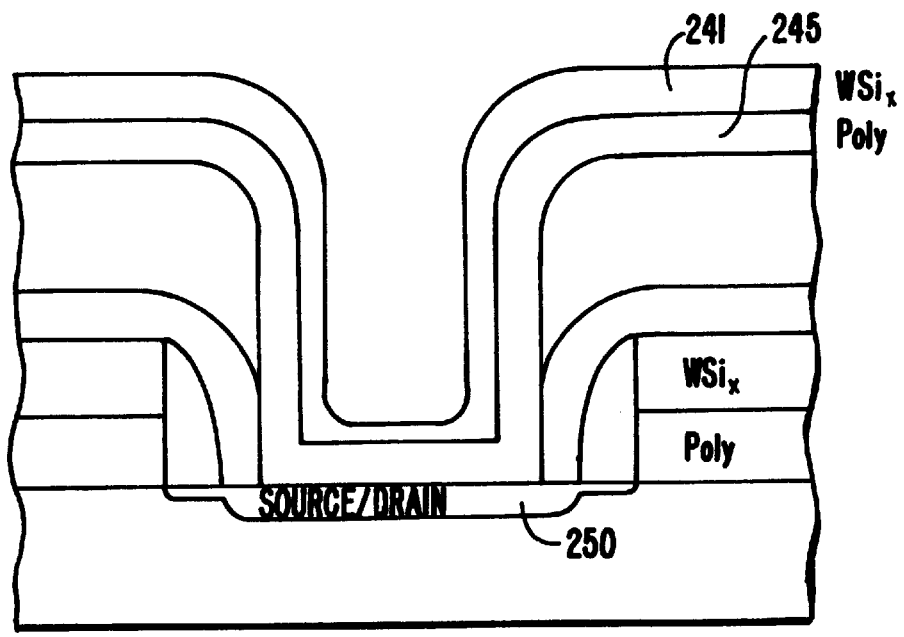
Figure 5:
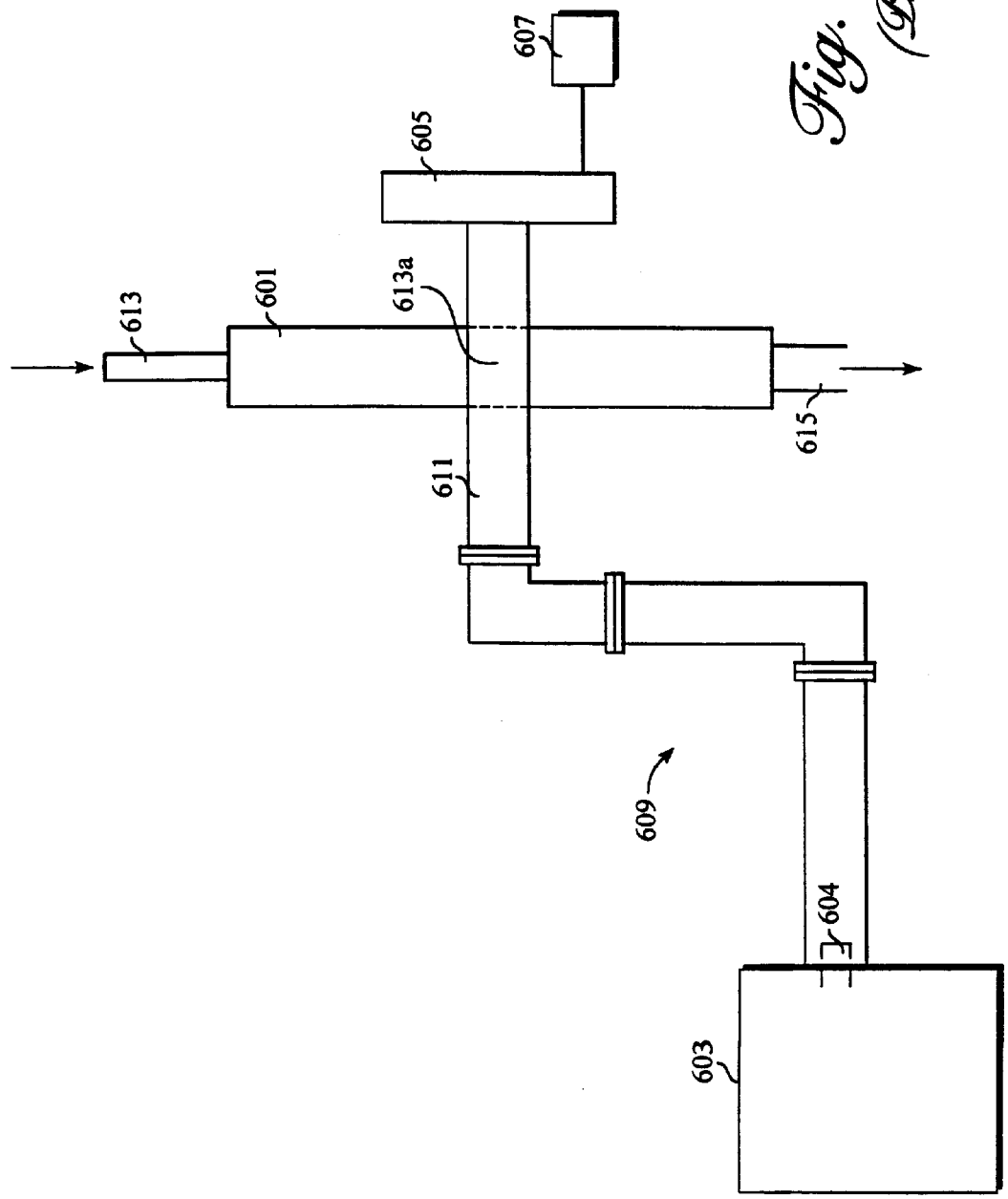
FIG. 5 illustrates an exemplary remote microwave plasma system according to the prior art.

For gate metallizations in some applications, a low resistivity tungsten silicide ($WSi_x$) film is deposited on top of a layer of polycrystalline silicon (polysilicon), to form a layered structure called a "polycide" structure. Two examples of such polycide structures are shown in FIGS. 2B and 2C. As seen in FIG. 2B, a $WSi_x$ film 210 is deposited over a polysilicon film 211 to form a gate structure 222 that is part of a field effect transistor. The transistor is fabricated on a silicon substrate 223 and also includes source and drain regions 225 and 231. In FIG. 2C, a $WSi_x$ film 241 is deposited over a polysilicon layer 245 as part of a contact structure to source/drain region 250.

It should be understood that simplified integrated circuit 200 shown in FIG. 2A and structures shown in FIGS. 2B and 2C are for illustrative purposes only. One of ordinary skill in the art could implement use of the present invention in relation to fabrication of other integrated circuits such as microprocessors, application specific integrated circuits (ASICs), memory devices, and the like. Further, the present invention may be applied to fabrication of PMOS, NMOS, CMOS, bipolar, or BiCMOS devices.

III. Specific embodiments: Remote Microwave Plasma System

According to specific embodiments of the present invention, an upgraded substrate processing apparatus, such as a CVD apparatus, may be provided by attaching a remote microwave plasma system to existing apparatus or by retrofitting the existing apparatus to incorporate the microwave plasma system. Although the discussion below focuses primarily on these specific embodiments, other embodiments within the scope of the invention will be apparent. Also, it should be noted that structures illustrated in FIGS. 3–4 are not necessarily drawn to scale.

FIG. 3A illustrates a cross-sectional lengthwise side view of a remote microwave plasma source module 300, and FIGS. 3B and 3C illustrate two different possible cross-sectional transverse plane views of module 300 along line A–A' of FIG. 3A, in accordance with specific embodiments of the present invention. FIG. 3D illustrates a cross-sectional lengthwise side view of a remote microwave plasma source module 300, in accordance with another specific embodiment. In particular, FIG. 3A shows the side view of a remote microwave plasma source module 300 that may be mountable onto the top lid 400 (as shown, for example, in FIG. 3A) or onto another part of the chamber, or be placed in some other convenient location. For example, module 300 may be mounted to the bottom or side of the downstream chamber with an appropriate conduit coupling the outlet of module 300 to an inlet of the chamber. FIG. 3B illustrates a plasma applicator 315 of FIG. 3A with an applicator body 320' that is rectangular, in accordance with some specific embodiments. FIG. 3C shows plasma applicator 315 of FIG. 3A with an applicator body 320 that is cylindrical, in accordance with other specific embodiments. Various embodiments of plasma applicator 315 are described in further detail below. Of course, in still other embodiments, the plama applicator may have a shape other than the rectangular or cylindrical applicators shown in FIGS. 3B and 3C.

As seen in FIG. 3A, the entire assembly of remote microwave plasma source module 300 includes a microwave source 305, preferably a magnetron, coupled via an antenna 307 to a waveguide system 310, and plasma applicator 315. Defining a volume therein, plasma applicator 315 includes a metal applicator body 320 having a gas inlet 325 and an outlet 330 formed therein, in accordance with a specific embodiment. In the embodiment shown in FIG. 3A, gas inlet 325 is disposed opposite outlet 330. In other specific embodiments, gas inlet 325 and outlet 330 may be formed at an angle relative to each other, in the same surface, and/or in other parts of plasma applicator 315. In the specific embodiment shown in FIG. 3A, gas inlet 325 and outlet 330 have similar dimensions. However, inlet 325 and outlet 330 may have different dimensions in other embodiments. Gas inlet 320 may be coupled to a gas source (not shown) via a supply line (also not shown) having a MFC or valve to control the rate of gas input to gas inlet 320 from the gas source.

A reactive gas from a gas source is input to gas inlet 325 into plasma applicator 315 where microwaves transmitted via waveguide system 310 from microwave source 305 form standing waves. The standing waves in applicator 315 ignite and maintain a plasma from the reactive gas, and reactive radicals are discharged from applicator 315 through outlet 330. The radicals are then transported downstream for use in a substrate processing apparatus for chamber cleaning, according a specific embodiment. In cleaning embodiments, the reactive gas is preferably nitrogen tri-fluoride ($NF_3$), but other fluorine-containing gases such as carbon tetra-fluoride ($CF_4$) or sulfur hexafluoride ($SF_6$) also may be used. Besides fluorine-containing gases, chlorine-containing gases also may be used as the reactive gas in other cleaning embodiments.

According to various embodiments, outlet 330 may be coupled to an input in chamber lid 400 of the substrate processing apparatus (as shown in FIG. 3A), or indirectly through a feed line coupling outlet 330 to the substrate processing apparatus. Outlet 330 of module 300 is coupled to a substrate processing chamber such that the internal volume of applicator 315 is under vacuum from the substrate processing chamber's pumping and exhaust system. In some embodiments, the radicals are transported from module 300 through the gas mixing system to the input manifold or faceplate of the downstream processing chamber. In other embodiments, the radicals may be transported from module 300 directly into the downstream processing chamber via a separate passage therethrough, thereby bypassing the mixing system and faceplate. In still other embodiments, the radicals formed may be used downstream in the substrate processing apparatus to deposit or etch a layer, with the appropriate reactive gases being used depending on the type of layer being deposited or etched. In some embodiments, outlet 330 is electrically isolated from processing chamber 400 with an RF isolator (not shown). The RF isolator isolates gas mixing block 9 and outlet 330 which are at an RF high from the lid and body of the processing chamber 400 which are grounded. RF isolator preferably is made of a material that provides RF isolation, such as polytetrafluoroethylene (PTFE), and which is resistant to etching or deposition by radicals (such as fluorine radicals when forming the plasma using a fluorine-containing gas like $NF_3$). In addition to PTFE (commercially available, for example, as Teflon™ PTFE), any fluorinated material including fluorinated polymers such as PFA (which is a polymer combining the carbon-fluorine backbone of polytetrafluoroethylene resins with a perfluoroalkoxy side chain), fluorinated ethylene-propylene (TFE), or the like, also may be used. Of course, other materials may be used that are resistant to the particular reactive chemistry used.

As mentioned above, one possible appropriate microwave source 305 that may be used in module 300 is magnetron 305. Magnetron 305 coupled to waveguide system 310 via a stub antenna 307 to provide microwaves, in accordance with the specific embodiment. Of course, other appropriate microwave sources besides magnetron 305 may be used. Stub antenna 307 is located on the order of substantially about a quarter-wavelength (at the operating microwave frequency) or its optimized equivalent distance away from an end of waveguide system 310, according to the specific embodiment. Alternatively, the stub antenna 307 may be replaced in a manner that is well known to one of ordinary skill in the art with a slot antenna or other radiating element that is able to communicate the microwaves from magnetron 305 to waveguide system 319.

Remote microwave plasma source module 300 uses magnetron 305 as the source for energy directed through waveguide system 310 to plasma applicator 315 for forming a plasma in the entire volume of plasma applicator 315. A number of different microwave power supplies are available, such as an inexpensive pulsed, low wattage power supply to generate between about 1–1.5 kW microwave power from the magnetron, or a high wattage, continuous wave (CW) power supply to generate typically up to about 2.5–6 kW microwave power from the magnetron. In some preferred embodiments, magnetron 305 may be the type of magnetron employed in some microwave ovens and be powered by a low cost, low wattage, pulsed 60 Hertz (Hz) half-rectified power source (which contains large ripples) to provide microwaves having a frequency of about 2.45 Gigahertz (GHz). Such pulsed, low wattage microwave generators can be at least two orders of magnitude lower in price than a high power CW microwave generator or an RF generator. In other preferred embodiments such as that shown in FIGS. 3A and 3C, magnetron 305 is a CW microwave source providing microwaves at about 2.45 GHz and between about 75 Watts (W) to about 1 kW of microwave power.

Waveguide system 310 may include more than one waveguide sections and tuning elements, which are well known to one of ordinary skill in the art. In the specific embodiment, waveguide system 310 may be a section of rectangular cross-sectional waveguide, but waveguides having other cross-sectional dimensions (e.g., circular) may be used in other embodiments. Preferably made of aluminum, waveguide system 310 also may be constructed of other metals, such as copper or stainless steel, or other conducting material. Waveguide system 310 includes waveguides with the dimensions needed to merely transmit microwave energy to plasma applicator 315 without selectively guiding particular modes, according to the specific embodiment. The waveguide may be of a length sufficient to accommodate close proximity and modularity with the magnetron sources used and with plasma applicator 315. In the specific embodiments, rectangular waveguides in waveguide system 310 transmit the microwave energy from magnetron 305 and may have any desired length with a waveguide width ($w_w$) of about 3.4 inches and a waveguide height ($h_w$) of about 1.7 inches. Part of waveguide system 310 is adjacent to microwave source 305 at one end and adjacent to plasma applicator 315 at its other end. Waveguide system 310 may also optionally include other optimizing features, such as directional couplers or a phase detector to monitor reflected power and/or an isolator with a load to absorb any reflected microwave power that could otherwise damage the magnetron.

As seen in FIG. 3A, plasma applicator 315 includes applicator body 320. In the embodiment shown in FIG. 3A, gas inlet 315 and outlet 330 are formed opposite each other in applicator body 320. Equipped at the juncture between the internal volume of applicator 315 and gas inlet 325 and the junction between the internal volume of applicator 315 and outlet 330, are microwave arrestors 332 and 334, respectively, which prevent the microwave plasma from escaping from the internal volume of applicator 315. Microwave arrestors 332 and 334 are preferably grids, or metal plates with small holes therethrough. In the specific embodiment, arrestors 332 and 334 are aluminum plates having a thickness ranging from about 0.05–0.25 inch, preferably about 0.14 inch, with small holes therethrough, each hole having a diameter of about 0.125 inch or less and a center-to-center hole separation ranging from about 0.1–0.4 inch, preferably about 0.31 inch. Microwaves with frequency of about 2.45 GHz are contained within applicator 315 due to microwave arrestors 332 and 334, and plasma cannot escape applicator 315 from gas inlet 325 or outlet 330. The holes in arrestors 332 and 334 respectively allow the reactive gases to enter the internal volume of applicator 315 and allow the radicals from the plasma to be transported from applicator 315 via outlet 330 for use downstream.

Plasma applicator 315 also includes a first end wall 335 and a second end wall 340, each connected to applicator body 320 to define the internal volume of applicator 315, as shown in FIG. 3A. Most of applicator 315, including applicator body 320 and second end wall 340 and part of first end wall 335, is constructed of metal, preferably aluminum. However, other metals such as copper or stainless steel also may be used. According to a specific embodiment, first end wall 335 of plasma applicator 315 is made of a microwave-transparent plate 342 with a metal flanged plate 344 that fits onto a notched portion 346 of applicator body 320. Microwave-transparent plate 342 may be made of any material that is transparent to microwaves, such as alumina ($Al_2O_3$) in either ceramic or sapphire form according to preferred embodiments. $Al_2O_3$ in sapphire form is most preferred in some specific embodiments. In specific embodiments, plate 342 has dimensions greater than the transverse dimensions of the internal volume of applicator 315, as seen in FIG. 3A. The thickness of microwave-transparent plate 342 is chosen in order to optimize for the durability of the $Al_2O_3$ plate 342 and for maximized microwave power transfer from waveguide system 310 into applicator 315.

According to the specific embodiment, metal flanged plate 344, which fits over one side of microwave-transparent plate 342, is attached to applicator body 320 via bolts or other fasteners disposed through through-holes (not shown) in the flanged portion of plate 344. Metal flanged plate 344 is preferably shaped to substantially correspond to the particular cross-sectional dimension of applicator body 320. As shown in FIG. 3A, flanged plate 344 has an opening 350 through which microwaves from waveguide system 310 enter via plate 342 into the internal volume of applicator 315. Opening 350 in flanged plate 344 has dimensions substantially corresponding to the cross-sectional dimensions of waveguide system 310. A sealing member 347, such as an O-ring, is preferably used between microwave-transparent plate 342 and applicator body 320 to ensure vacuum integrity of the internal volume of applicator 315. In other embodiments, a sealing member 348, such as an O-ring, may optionally be used between microwave-transparent plate 342 and flanged plate 344 when connected to applicator body 320. Sealing members 347 and/or 348 may be made of metal, such as aluminum, or of Teflon™ or other appropriate material impervious to microwaves. In alternative embodiments, flanged plate 344 may be brazed or otherwise hermetically sealed to microwave-transparent plate 342 to ensure vacuum integrity of applicator 315. In other embodiments, screws, welding, brazing or other fastening mechanisms may be used to connect first end wall 335 and/or second end wall 340 to applicator body 320.

According to some specific embodiments, first end wall 335 optionally further includes a metal plate 352 having an aperture 354 to guide microwaves transmitted through microwave-transparent plate 342 into applicator 315. In embodiments where disposed proximate to the side of microwave-transparent plate 342 facing the internal volume of applicator 315, metal plate 352 of first end wall 335 further defines the internal volume of applicator 315, as shown in FIG. 3A. In these embodiments, a hermetic seal also may be used between metal sheet 348 and microwave-transparent plate 342 to ensure vacuum integrity of applicator 315 at the junction between first end wall 335 and applicator body 320. In embodiments where disposed proximate to the side of microwave-transparent plate 342 facing waveguide system 310, microwave-transparent plate 342 of first end wall 335 defines the internal volume of applicator 315, as shown in FIG. 3D.

In the specific embodiment, second end wall 340 is connectable to applicator body 320 via bolts through appropriate holes (not shown in FIG. 3A) therethrough. In some preferred embodiments, second end wall 340 is removably attached to applicator body 320 so that, periodically, the interior of applicator 315 may be physically wiped down with a special cloth and cleaning fluids.

As described earlier, microwaves from magnetron 305 are transmitted through waveguide system 310 and enter applicator 315 via first end wall 335 (opening 350 and microwave-transparent plate 342, and in some embodiments aperture 354), to ignite and sustain a plasma from reactive gases introduced into the internal volume of applicator 315. With the present invention, a plasma-enhancing gas such as argon, which may be used, is not needed to ignite the plasma in applicator 315 of module 300.

In accordance with the embodiment shown by FIGS. 3A and 3B, module 300 utilizes a rectangular plasma applicator having an applicator length ($l_{AP}$), an applicator width ($w_{AP}$) and an applicator height ($h_{AP}$), with the $l_{AP}$ chosen such that one of the $TE_{10n}$ resonance modes (where n is an integer) can be excited to form standing waves in applicator 315. With a rectangular applicator, the dimensions of the four side surfaces defined by $w_{AP}$ and $h_{AP}$ may be designed in a specific embodiment to be the same or similar to those ($w_w$ and $h_w$) of the transmission waveguide in waveguide system 310 in order to minimize the reflected power at first end wall 335 of applicator 315. Of course, the rectangular applicator dimensions may be selected differently if other resonance modes besides $TE_{10n}$ are desired to be excited.

In accordance with another specific embodiment shown by FIGS. 3A and 3C, module 300 utilizes a cylindrical plasma applicator having an applicator length ($l_{AP}$) and an applicator radius ($r_{AP}$), with $l_{AP}$ and $r_{AP}$ chosen to excite one of the $TE_{11n}$ resonance modes (where n is an integer). FIGS. 4A–4C are more specific views of a cylindrical applicator 315 including applicator body 320 and metal sheet 352, according to a specific embodiment. In particular, FIG. 4A is a cross-sectional side lengthwise view of a cylindrical plasma applicator used in an embodiment of module 300, according to a specific embodiment of the present invention. FIG. 4B is a plane view of one end of the cylindrical plasma applicator shown in FIG. 4A, according to the specific embodiment of the present invention. FIG. 4C is a plane view of the other end of the cylindrical plasma applicator shown in FIG. 4A, according to the specific embodiment of the present invention.

According to various specific embodiments, cylindrical applicator dimensions may range from about 2–4 inches for $l_{AP}$ and from about 1.5–5 inches for $r_{AP}$. In the specific embodiment, the $TE_{111}$ resonance mode is excited by making $l_{AP}$ about 3.67 inches and $r_{AP}$ about 2 inches. Of course, the cylindrical applicator dimensions may be selected differently if other resonance modes besides $TE_{111}$ are desired to be excited. Waveguide system 310 transmits microwaves to plasma applicator 315 via opening 350/plate 342 (and optionally aperture 354) in first end wall 335 of plasma applicator 315. In the specific embodiment, the thickness of microwave-transparent plate 342 ranges from about 0.25–0.75 inch, and is preferably about 0.4 inch, in order to optimize for the durability of the $Al_2O_3$ plate 342 and for maximized microwave power transfer from waveguide system 310 into applicator 315. In the specific embodiment, microwave-transparent plate 342 has a radius ranging from about 1–5 inches, preferably about 2.5 inches, with sealing member 347 having a radius slightly less than the radius of plate 342, preferably about 2.25 inches. Having a thickness ranging from about 0.001–0.25 inch, preferably about 0.125 inch, metal sheet 352 having aperture 354 adjacent to plate 342 further defines the internal volume of applicator 315, according to the specific embodiment shown in FIG. 3A. The thickness of metal sheet 352 is optimized in order to provide good contact and heat transfer from microwave-transparent plate 342 to reduce thermal shock and in order to prevent arcing. In some embodiments, metal sheet 352 may be a metal foil or a sputtered or otherwise deposited metal layer on plate 342. From the microwaves transmitted by waveguide system 310 through opening 350, microwave-transparent plate 342 and aperture 354, the $TE_{111}$ mode of the microwaves forms standing waves in plasma applicator 315. FIG. 4B is a plane view (looking into arrows formed by line B–B') of the end of applicator 315 with aperture 354. As seen in FIG. 4B in accordance with this specific embodiment, aperture 354 is located substantially in the center of metal sheet 352 of first end wall 335 of applicator 315. In this embodiment, aperture 354 is a substantially rectangular opening with a width ($w_A$) of about 2.41 inches and a height ($h_A$) of about 0.38 inch. However, aperture 354 may also be circular or other shape, with different dimensions, according to other specific embodiments.

In the preferred specific embodiment illustrated in FIGS. 4A–4C, applicator 315 includes applicator body 320 having gas inlet 325 with microwave arrestor 332, outlet 330 with microwave arrestor 334, and metal sheet 352 with aperture 354. According to the specific embodiment, gas inlet 325 is formed in the top side of applicator body 320 and has a cross-sectional circular dimension with a diameter ranging from about 0.125–5 inches, preferably ranging from about 0.75–2 inches, most preferably about 1 inch. In other embodiments, multiple gas inlets may be formed in applicator body 320 to provide additional gas into applicator 315. Outlet 330 having a cross-sectional circular dimension with a diameter ranging from about 0.125–5 inches, preferably ranging from about 0.75–2 inches, most preferably about 1 inch, is formed in the bottom side of applicator body 320 opposite gas inlet 325, in the specific embodiment. Inlet 325 and outlet 330 are located about mid-point along the length of applicator 315 in the specific embodiment. In alternative embodiments, inlet 325 and outlet 330 may be formed in other locations, such as in second end wall 340, in applicator 315, as shown in FIG. 3D. In this embodiment, metal sheet 352 is integrally formed with applicator body 320, but metal sheet 352 may be separately formed and connected with applicator body 320 in other embodiments. The outer edge of applicator body 320 near metal sheet 352 is machined to provide an annular groove 450 (shown in FIGS. 4A and 4B) which holds sealing member 347, such as an O-ring, used between applicator body 320 and microwave-transparent plate 342 (not shown in FIG. 4A). The outer edges of applicator body 320 are machined to provide at least two surfaces that are to form annular passages 500 with an applicator body thickness ranging from about 0.05–0.25 inch, preferably about 0.14 inch, separating passages 500 from the internal volume of applicator 315. The total thickness of applicator body 320 ranges from about 0.2–3 inches, preferably about 1 inch, so that applicator body 320 meets strength requirements and heat transfer passages 500 are accommodated. Annular passages 500 are described below in more detail.

According to the specific embodiment, applicator 315 is also provided with a first annular edge ring 510 and a second annular edge ring 520, which form at least one surface of annular passages 500 when the first annular edge ring 510 and second annular edge ring 520 are welded (where arrows indicate, preferably using electron beam or E-beam welding) onto applicator body 320. First annular edge ring 510 is appropriately equipped with blind holes 525 for holding screws or bolts (not shown) used to fasten flange 344 coupled to microwave-transparent plate 342 onto applicator body 320. Second annular edge ring 520 also is appropriately equipped with blind holes 535 for holding screws or bolts (not shown) used to fasten second end wall 340 (not shown in FIGS. 4A and 4C) having multiple corresponding through-holes onto applicator body 320. According to a specific embodiment, the end of applicator body 320 is machined near second annular edge ring 520 to provide a groove 545 (for a sealing member such as an O-ring (not shown) made of metal, Teflon™ or other microwave-impervious material) when second annular edge ring 520 has been welded onto applicator body 320, as seen in FIGS. 4A and 4C. FIG. 4C is a plane view (looking into arrows formed by line C–C' in FIG. 4A) of the end of applicator 315 with second annular edge ring 520. A sealing member is disposed in groove 545 between second end wall 340 and applicator body 320 when second end wall 340 is fastened onto applicator body 320 with screws or bolts, in the specific embodiment. As mentioned above, applicator 315 may be opened (by unfastening second end wall 340 from second annular edge ring 520 welded onto applicator body 320) so that the internal volume of applicator 315 may be cleaned periodically as needed.

As seen in FIG. 4A, applicator body 320 includes multiple heat exchange passages (not shown in FIG. 3A) formed therein. In the specific embodiment shown in FIG. 4A, there are two heat exchange or annular passages 500 with appropriate inlets for heat exchange fluid, such as coolant or water. These heat exchange passages 500 built into the aluminum applicator body 320 provide direct and efficient cooling to applicator 315. In the specific embodiment, each annular heat exchange passage 500 has a cross-sectional dimension with length ranging from about 0.1–1 inch, preferably about 0.53 inch, and a height ranging from about 0.1–1 inch, preferably about 0.4 inch. In other embodiments, different dimensions and/or other types of cross-sections may be used for passages 500. Such direct cooling of applicator body 320 advantageously minimizes particle formation within applicator 315 to provide radicals via outlet 330 and microwave arrestor 334 to the downstream substrate processing chamber. For example, when using a fluorine-containing reactive gas such as $NF_3$ to form the plasma in applicator 315, the reactive gas reacts with the aluminum applicator body and other surfaces of applicator 315 to form aluminum fluoride (AlF) thereon. Typically, such AlF forms at rates on the order of $\mu$ms per minute in remote plasma systems reaching temperatures of about 400° C. Using various heat exchange fluids, such as water, water-based ethylene glycol, or oil-based thermal transfer fluids, through heat exchange passages 500, plasma applicator 315 may be maintained at a predetermined temperature ranging from about 0–100° C., such that AlF is believed to form at significantly slower rates on the order of $\mu$ms per year. Specifically, use of water, for example, at about 20–25° C., circulating through heat exchange passages 500 at a rate of at least about 2 liters/minute, preferably about 3 liters/minute, can maintain applicator 315 at temperatures as low as room temperature (approximately 25° C.). As another example, water at temperatures lower than about 20° C. at about 3 liters/minute can maintain applicator 315 at temperatures lower than approximately 25° C. In other embodiments, other heat exchange fluids at different temperatures can also be used to maintain applicator 315 at any desired temperature. By providing thermal contact of microwave-transparent plate 342 via flanged plate 344 to the directly-cooled applicator body 320, the temperature of microwave-transparent plate 342 is advantageously lowered so that cracking of plate 342 due to thermal shock can be avoided or at least minimized.

In the present invention, reactive gases that are supplied to applicator 315 via gas inlet 325 and through microwave arrestor 332 can be ignited using fairly low microwave power to form a plasma sustained by the standing waves formed in applicator 315. In particular, increasing the dimensions of outlet 330 allows greater pump out rates, which thereby decreases the microwave power needed to ignite the plasma in applicator 315. In another specific embodiment, gas inlet 325 with diameter of about 1 inch and outlet 330 with diameter of about 1 inch may be formed in second end wall 340 resulting in increased pump out rates for lower microwave power for plasma ignition, since outlet 330 does not compete for space with heat exchange passages 500. For example, as low as about 250 W of microwave power is needed to ignite the plasma in applicator 315, in contrast to conventional microwave plasma systems where a UV lamp or a high microwave power levels on the order of 3 kW are required to strike plasma. With the present invention, a plasma can be struck in applicator 315 without the use of a plasma-enhancing gas like argon and without a UV lamp, which allows a more economic module 300 by eliminating the expense of a UV lamp and an argon gas source. Advantageously, microwaves resonating in plasma applicator 315 are able to energize reactive gases in the entire volume of plasma applicator 315 for efficient microwave energy usage and effective plasma ignition, compared to conventional remote microwave plasma systems where a small volume in a plasma applicator tube (disposed through a small portion of waveguide) contains the plasma. In the present invention, the vacuum of the downstream substrate processing chamber causes radicals in the microwave-generated plasma to exit applicator 315 via outlet 330 and be subsequently provided to the connected vacuum chamber. Due to changes in impedance within the internal volume of plasma applicator 315 from the introduction and energizing of reactive gases, use of tuning stubs with waveguide system 310 may optimize the microwave energy coupling. In alternative preferred embodiments, E-field detectors or probes, such as multiple directional couplers or a phase detector, may be installed to gauge the microwave energy within waveguide system 310 and enable automated tuning of stubs via robotized motors under the control of system controller 34 which would be connected to receive the measurements from the E-field detectors or probes.

According to the embodiment shown in FIGS. 3A, 3C and 4A–4C, remote module 300 may be used to provide reactive radicals used for cleaning a downstream substrate processing chamber. For example, a reactive gas such as $NF_3$ may be introduced into applicator 315 at a flow rate ranging from about 25–5000 standard cubic centimeters per minute (sccm), preferably from about 100–2000 sccm, and most preferably about 250 sccm in a specific embodiment, through gas inlet 325 and holes in microwave arrestor 332. With applicator 315 maintained at an internal applicator pressure ranging from about 1–20 torr, preferably ranging from about 3–10 torr, and most preferably about 6.5 torr in a specific embodiment, the reactive gas may be ignited into a plasma using only about 150–500 W from the microwave power source, for diameter dimensions ranging from about 1–2 inches for outlet 330. Other remote microwave plasma systems typically require much lower internal pressures (less than about 1 torr), use of a plasma-enhancing gas like argon, and/or much higher power levels (on the order of about 3 kW) in order to strike and sustain a plasma. For cleaning applications, residues in substrate processing chamber 400 between gas mixing block 9 and the gas exhaust manifold are then cleaned by the radicals output from the attached remote microwave plasma source module 300 via holes in microwave arrestor 334 to outlet 330. From processing chamber 400, an exhaust system then exhausts the residue and gases via ports into a vacuum manifold and out an exhaust line by a vacuum pump system, with the pressure at which the gases and residue are released through the exhaust line being controlled by a throttle valve and pumping system. In accordance with other embodiments, remote module 300 also may be used for depositing or etching a layer.

For $NF_3$ gas flow of about 250 sccm into applicator 315 with a pressure therein of about 10 torr and a diameter of about 1 inch for outlet 330, about 500 W total microwave power generated by the magnetron can ignite a plasma and is believed to be able to produce a gas breakdown efficiency of at least about 50% and possibly up to about 99% or greater. As another example, $NF_3$ gas flow of about 250 sccm into applicator 315 with a pressure therein of about 6.5 torr and a diameter of about 1 inch for outlet 330, about 350 W total microwave power generated by the magnetron can ignite a plasma and is also believed to be able to produce a gas breakdown efficiency of at least about 50% and possibly up to about 99% or greater. For a given flow rate and outlet diameter, pressure in applicator 315 was found to determine the microwave power needed for plasma ignition. Thus, the remote microwave plasma module of the present invention results in a higher cleaning efficiency than capacitively coupled electrodes, which typically produce a gas breakdown efficiency of between about 15–30%.

The above-described gas flow, chamber pressure and temperature ranges provide for cleaning procedures that are sufficient to remove undesired residues such as tungsten silicide residues that may be built up over time after processing multiple wafers or substrates. The parameters in the above processes should not be considered limiting to the claims. Other oxide, nitride or metal-containing residues may be cleaned using the present invention in substrate processing apparatus depositing other types of films besides tungsten silicide. The actual values (temperature, pressure, gas flows, etc.) selected for a particular cleaning recipe will vary according to various applications. Also, flow values mentioned above are for applicator 315 used with a DCSxZ chamber (equipped for a 200-mm wafer and with a total volume of about 7 liters) manufactured by Applied Materials, but flow values would differ depending on the type or size of chamber used and size of outlet 330. In addition, flow values described above are for applicator 315 and/or outlet 330 with dimensions according to the specific embodiments and may differ for applicators and/or outlets with other dimensions. One of ordinary skill in the art may also use other chemicals, chamber parameters, and conditions for cleaning with the present invention.

The above embodiments of the present invention are useful in cleaning CVD apparatus or other apparatus. The usefulness of the present invention is demonstrated for cleaning of CVD apparatus using $NF_3$ as an exemplary reactive gas. However, other reactive gases such as $CF_4$, and ClF$_3$ also may be used. The rate at which the reactant gas is introduced into applicator 315 may be controlled by system controller 34 of CVD system 10 through a valve or MFC in the gas feed line. The reactant gas initially may flow into applicator 315 without application of power to the magnetron to provide gas flow stabilization. This gas flow stabilization may last about 0.25–10 seconds, preferably about 1 second, in a specific embodiment before powering the magnetron. Then, fluorine radicals (and possibly also NF$_3$) from the plasma created in applicator 315 of the remote module 300 flow from outlet 330 downstream into the substrate processing chamber to efficiently and gently clean the residues in the processing chamber. The selected processing chamber pressure to provide the internal applicator pressure is set and maintained throughout the cleaning by a throttle valve in conjunction with the vacuum pump system of the substrate processing chamber. The throttle valve and the vacuum pump system are all controlled by system controller 34 in setting and maintaining the selected pressure. After being set, processing conditions are maintained by system controller 34 for a selected time period ranging from about 50–1000 seconds, preferably ranging from about 150–500 seconds, and most preferably about 340 seconds, for the entire cleaning procedure. Once the magnetron is powered down after the cleaning is complete, the pressure may be allowed to stabilize for about 0.25–10 seconds, preferably about 5 seconds, before bringing the pressure to the desired level for the subsequent process step to occur in the chamber.

In addition to providing upgraded capability of cleaning procedures, the embodiment of FIGS. 4A–4C also is capable of being used for deposition and etching as required for other process steps, thereby saving time and providing other advantages. Moreover, if remote module 300 is top-mounted to processing chamber 400, the procedure for removal of remote module 300 from processing chamber 400 may be easily accomplished by simply detaching and removing the remote module from the lid of processing chamber 400. Therefore, preventive maintenance cleaning of processing chamber 400 involves easy removal the remote module to open the lid, resulting in less wasted time. Similarly, a bottom-mounted or side-mounted module 300 also may permit easy access to processing chamber 400 for preventive maintenance cleaning, as the module would not need to be removed.

It is to be understood that the above description is intended to be illustrative and not restrictive. Many embodiments will be apparent to those of skill in the art upon reviewing the above description. By way of example, the inventions herein have been illustrated primarily with regard to a cleaning apparatus, but they are not so limited. Those skilled in the art will recognize other equivalent or alternative methods of depositing or etching various layers while remaining within the scope of the claims of the present invention. Although the above description discusses NF$_3$ in particular, other reactive gases including dilute F$_2$, CF$_4$, C$_2$F$_6$, C$_3$F$_8$, SF$_6$, or ClF$_3$ may be used for cleaning substrate processing systems used to deposit tungsten silicide residue, or other undesired residues depending on the specific substrate process used in the system. Although the above-described embodiments excite a single mode of resonance, other embodiments may take advantage of multimode resonance or use other frequencies besides about 2.45 GHz. Alternatively, deposition or etching gases may be used for embodiments where the microwave plasma system is used for deposition or etching. In addition to being used with CVD chambers, the remote plasma modules described above may be used with etch chambers, physical vapor deposition (PVD) chambers, or other chambers. Further, although specific dimensions for various portions of the apparatus have been described according to specific embodiments, some specific dimensions are exemplary and other dimensions may be used for other embodiments. Although annular heat exchange passages are described for the specific embodiment, other types of heat exchange passages may be formed in applicator body. The scope of the inventions should, therefore, be determined not with reference to the above description, but should instead be determined with reference to the appended claims, along with the full scope of equivalents to which such claims are entitled.

What is claimed is:

1. A remote microwave plasma apparatus comprising:
   a body defining a resonant cavity and having a fluid inlet and a fluid outlet;
   a source of microwave energy in electrical communication with said cavity; and
   a microwave arrestor positioned within said fluid outlet, extending coextensive with a cross-sectional area of said fluid outlet.

2. The apparatus of claim 1 wherein said body has heat exchange passages.

3. The apparatus of claim 2 wherein said resonant cavity has a cylindrical shape.

4. The apparatus of claim 3 wherein said resonant cavity has a length ranging from about 2–4 inches and a radius ranging from about 1.5–5 inches.

5. The apparatus of claim 2 wherein said fluid outlet is disposed in said second end wall.

6. The apparatus of claim 5 wherein said fluid inlet is disposed in said second end wall.

7. The apparatus of claim 1 wherein said resonant cavity has a rectangular shape.

8. The apparatus of claim 1 wherein said fluid inlet and said fluid outlet have a substantially circular cross-section.

9. The apparatus of claim 8 wherein said body includes first and second spaced-apart end walls, with a microwave-transparent plate disposed in said first end wall.

10. The apparatus of claim 9 wherein said microwave-transparent plate is comprised of Al$_2$O$_3$.

11. The apparatus of claim 8 wherein said body further includes a conductive wall extending between said first and second end walls.

12. The apparatus of claim 11 wherein said fluid inlet and said fluid outlet are disposed in said conductive wall.

13. The apparatus of claim 11 wherein said fluid inlet and said fluid outlet are disposed in said second end wall.

14. The apparatus of claim 1 wherein said fluid inlet is in fluid communication with a supply of reactive gas, with said reactive gas being selected from a group consisting of NF$_3$, dilute F$_2$, CF$_4$, C$_2$F$_6$, C$_3$F$_8$, SF$_6$, and ClF$_3$.

15. The apparatus recited in claim 1 including an additional microwave arrestor positioned within said fluid inlet and extending coextensive with a cross-sectional area thereof.

16. The apparatus recited in claim 15 wherein said body has a first end wall and a second end wall, spaced-apart from said first end wall, with said first end wall including a microwave-transparent portion, with side walls extending between said first and second end walls.

17. The apparatus recited in claim 16 wherein said second end wall and said side walls are formed from electrically conductive material.

18. The apparatus recited in claim 14 wherein said resonant cavity has a rectangular cross-section.

19. The apparatus recited in claim 17 wherein said resonant cavity has a circular cross-section.

20. The apparatus as recited in claim 17 wherein said fluid inlet is disposed opposite to said fluid outlet.

21. The apparatus as recited in claim 17 wherein said fluid inlet is coplanar with said fluid outlet.

22. An improved substrate processing system comprising:

a processing chamber;

a gas delivery system configured to deliver a reactive gas to said processing chamber;

a heating system including a pedestal in said processing chamber, said pedestal for holding a substrate, said pedestal being heated to a selected temperature;

a vacuum system configured to set and maintain a selected pressure within said processing chamber;

a remote microwave plasma system coupled to said processing chamber, said remote microwave plasma system comprising, a conductive plasma applicator defining an internal volume, said applicator including, a first end wall, said first end wall including a microwave-transparent plate, a conductive second end wall opposite said first end wall, a gas inlet for receiving a reactive gas into said internal volume of said applicator, and an outlet, said gas inlet and said outlet equipped with microwave arrestors.

23. The apparatus of claim 22 further comprising:

a controller configured to control said gas delivery system, said heating system, said remote microwave plasma system, and said vacuum system; and a memory, coupled to said controller, comprising a computer-readable medium having a computer-readable program embodied therein for directing operation of said apparatus.

24. The apparatus of claim 23 wherein said third subset of computer instructions controls said remote microwave plasma system to direct said microwave energy at a power level ranging from about 150–500 W to ignite said plasma in said applicator.

25. The improved apparatus of claim 23 wherein said computer-readable program includes:

a first set of computer instructions for introducing said radicals from said plasma into said processing chamber from said outlet of said plasma applicator, said first set of computer instructions including:

a first subset of computer instructions for controlling said gas delivery system to introduce said reactive gas at a first rate to said gas inlet during a first time period at a first flow rate;

a second subset of computer instructions for controlling said vacuum system to maintain a pressure of about 1–20 torr within said applicator during said first time period; and a third subset of computer instructions for controlling said remote microwave plasma system to direct said microwaves into said internal volume of said applicator during said first time period.

26. The apparatus of claim 22 wherein said gas inlet is in fluid communication with said gas delivery system, with said reactive gas is selected from a group consisting of $NF_3$, dilute $F_2$, $CF_4$, $C_2F_6$, $C_3F_8$, $SF_6$, and $ClF_3$.

27. The apparatus of claim 22 wherein said conductive plasma applicator and said conductive second wall are comprised of metal.

28. The apparatus of claim 22 wherein said microwaves form standing waves in said internal volume.

* * * * *